(12) United States Patent
Stallcup, II et al.

(10) Patent No.: US 12,306,241 B2
(45) Date of Patent: May 20, 2025

(54) AUTOMATED PROBE LANDING

(71) Applicant: Innovatum Instruments Inc., Los Altos, CA (US)

(72) Inventors: Richard E Stallcup, II, Frisco, TX (US); Michael Berkmyre, Princeton, TX (US); Carlo Floresca, Frisco, TX (US); Ronen Benzion, Los Altos, CA (US)

(73) Assignee: Innovatum Instruments Inc., Los Altos, CA (US)

( * ) Notice: Subject to any disclaimer, the term of this patent is extended or adjusted under 35 U.S.C. 154(b) by 315 days.

(21) Appl. No.: 17/943,847

(22) Filed: Sep. 13, 2022

(65) Prior Publication Data

US 2023/0258707 A1 Aug. 17, 2023

Related U.S. Application Data

(60) Provisional application No. 63/267,983, filed on Feb. 14, 2022.

(51) Int. Cl.
*G01R 31/265* (2006.01)
(52) U.S. Cl.
CPC ............................. *G01R 31/2653* (2013.01)
(58) Field of Classification Search
CPC .................................................. G01R 31/2653
See application file for complete search history.

(56) References Cited

U.S. PATENT DOCUMENTS

| 3,345,567 A | 10/1967 | Turner et al. |
| 5,019,771 A | 5/1991 | Yang et al. |

(Continued)

FOREIGN PATENT DOCUMENTS

| CN | 211043432 | 7/2020 |
| CN | 113281298 | 8/2021 |

(Continued)

OTHER PUBLICATIONS

Alpuche-Aviles et al: "Impedance Feedback Control for Scanning Electrochemical Microscopy," Analy. Chem., Oct. 15, 2001, 73(20):4873-4881.

(Continued)

*Primary Examiner* — Reena Aurora
(74) *Attorney, Agent, or Firm* — Fish & Richardson P.C.

(57) ABSTRACT

A nanoprober system can land a probe onto a device under test (DUT) by positioning a conductive probe above the DUT by a motion control device; applying electrical signals between the conductive probe and the DUT; measuring electrical responses from the applied electrical signal; calculating impedance magnitude values and/or phase angle values based on the measured electrical response values; causing the conductive probe to move towards the DUT while continuing to calculate impedance magnitude values and/or phase angle values from measured electrical response; determining that the conductive probe has contacted the DUT based on a change in the calculated impedance magnitude values and/or phase angle values; and signaling to the motion control device to stop moving the probe towards the DUT based on the change in the calculated impedance magnitude values and/or phase angle values.

25 Claims, 17 Drawing Sheets

(56) References Cited

U.S. PATENT DOCUMENTS

| | | |
|---|---|---|
| 5,193,383 A | 3/1993 | Burnham et al. |
| 5,644,245 A | 7/1997 | Saitoh et al. |
| 5,705,814 A | 1/1998 | Young et al. |
| 6,703,258 B2 | 3/2004 | Hopson et al. |
| 6,853,204 B2 | 2/2005 | Nishiyama et al. |
| 6,891,170 B1 | 5/2005 | Yu et al. |
| 6,960,765 B2 * | 11/2005 | Tomimatsu ............ B82Y 35/00 850/10 |
| 6,967,335 B1 | 11/2005 | Dyer et al. |
| 7,057,408 B2 | 6/2006 | Schneidewind et al. |
| 7,319,336 B2 | 1/2008 | Baur et al. |
| 7,373,265 B2 | 5/2008 | Gibson et al. |
| 7,473,887 B2 | 1/2009 | Miles et al. |
| 7,656,075 B2 | 2/2010 | Voigtländer et al. |
| 7,659,742 B1 | 2/2010 | Jacobson et al. |
| 7,777,183 B2 * | 8/2010 | Kaneoka ............ G01N 23/225 250/311 |
| 7,786,436 B1 | 8/2010 | Lundquist et al. |
| 7,888,143 B1 | 2/2011 | Keating et al. |
| 8,438,660 B2 | 5/2013 | Hirooka et al. |
| 8,536,526 B2 | 9/2013 | Bell et al. |
| 8,895,923 B2 | 11/2014 | Ukraintsev et al. |
| 8,910,311 B2 | 12/2014 | Humphris et al. |
| 8,971,099 B1 | 3/2015 | Wang et al. |
| 9,057,740 B1 | 6/2015 | Ukraintsev et al. |
| 9,134,367 B2 | 9/2015 | Pagani |
| 9,170,273 B2 | 10/2015 | Kane et al. |
| 9,506,947 B2 | 11/2016 | Ukraintsev et al. |
| 9,551,743 B2 | 1/2017 | Erickson |
| 9,709,600 B2 | 7/2017 | Barends et al. |
| 9,805,910 B1 | 10/2017 | Trease et al. |
| 9,891,280 B2 | 2/2018 | Ukraintsev et al. |
| 10,175,295 B2 | 1/2019 | Ukraintsev et al. |
| 10,373,799 B2 | 8/2019 | Neuman |
| 10,539,589 B2 | 1/2020 | Ukraintsev et al. |
| 10,613,115 B2 | 4/2020 | Amponsah |
| 11,029,336 B2 | 6/2021 | Vettori et al. |
| 2005/0269511 A1 | 12/2005 | Tomimatsu et al. |
| 2009/0189075 A1 | 7/2009 | Nishiyama et al. |
| 2010/0019786 A1 | 1/2010 | Potok et al. |
| 2010/0064784 A1 | 3/2010 | Caudill et al. |
| 2010/0163727 A1 | 7/2010 | Bell et al. |
| 2011/0151597 A1 | 6/2011 | Chang et al. |
| 2011/0291009 A1 | 12/2011 | Ando et al. |
| 2012/0086466 A1 | 4/2012 | Chou |
| 2013/0032714 A1 | 2/2013 | Kitayama et al. |
| 2014/0380531 A1 | 12/2014 | Ukraintsev et al. |
| 2015/0377958 A1 | 12/2015 | Ukraintsev et al. |
| 2015/0380210 A1 | 12/2015 | Budach et al. |
| 2016/0370425 A1 | 12/2016 | Stallcup et al. |
| 2017/0003336 A1 | 1/2017 | Ippolito et al. |
| 2017/0115341 A1 | 4/2017 | Frigoli et al. |
| 2020/0278380 A1 | 9/2020 | Osterberg et al. |
| 2021/0125808 A1 | 4/2021 | Floresca et al. |
| 2021/0270891 A1 | 9/2021 | Komori et al. |
| 2021/0375657 A1 | 12/2021 | Krupyshev et al. |
| 2023/0168274 A1 | 6/2023 | Stallcup, II et al. |

FOREIGN PATENT DOCUMENTS

| | | |
|---|---|---|
| DE | 102018009623 B4 | 3/2021 |
| EP | 1045253 | 10/2000 |
| EP | 3467519 A1 | 4/2019 |
| JP | H05-215812 | 8/1993 |
| JP | H07-240445 | 9/1995 |
| JP | H08-115959 | 5/1996 |
| JP | H09-326425 | 12/1997 |
| JP | 2000-284025 | 10/2000 |
| JP | 2001-110347 | 4/2001 |
| JP | 2001-324459 | 11/2001 |
| JP | 2003-273175 | 9/2003 |
| JP | 2005-327883 | 11/2005 |
| JP | 2005333161 A | 12/2005 |
| JP | 2006227108 A | 8/2006 |
| JP | 2007-258271 | 10/2007 |
| JP | 2008-115959 | 5/2008 |
| JP | 2008-204813 | 9/2008 |
| JP | 2009-122122 | 6/2009 |
| JP | 4625375 B2 | 2/2011 |
| JP | 4625376 | 2/2011 |
| JP | 2011033422 | 2/2011 |
| JP | 2012-083230 | 4/2012 |
| JP | 2019-090626 | 6/2019 |
| JP | 2021-111639 | 8/2021 |
| KR | 20100119432 | 11/2010 |
| TW | 201123330 | 7/2011 |
| WO | WO 2011/129315 | 10/2011 |

OTHER PUBLICATIONS

Extended European Search Report in European Appln. 22210556.1, dated Apr. 28, 2023, 13 pages.
Extended European Search Report in European Appln. No. 23156133.3, dated Jul. 11, 2023, 15 pages.
Lee et al: "An impedance based non-contact feedback control system for scanning probe microscopes," Rev. Sci. Instrum., Apr. 1, 1996, 67(4):1468-1471.
Ru et al: "Automated Four-Point Probe Measurement of Nanowires Inside a Scanning Electron Microscope," IEEE Transactions on Nanotechnology, IEEE, USA, Jul. 1, 2011, 10(4):674-681.

* cited by examiner

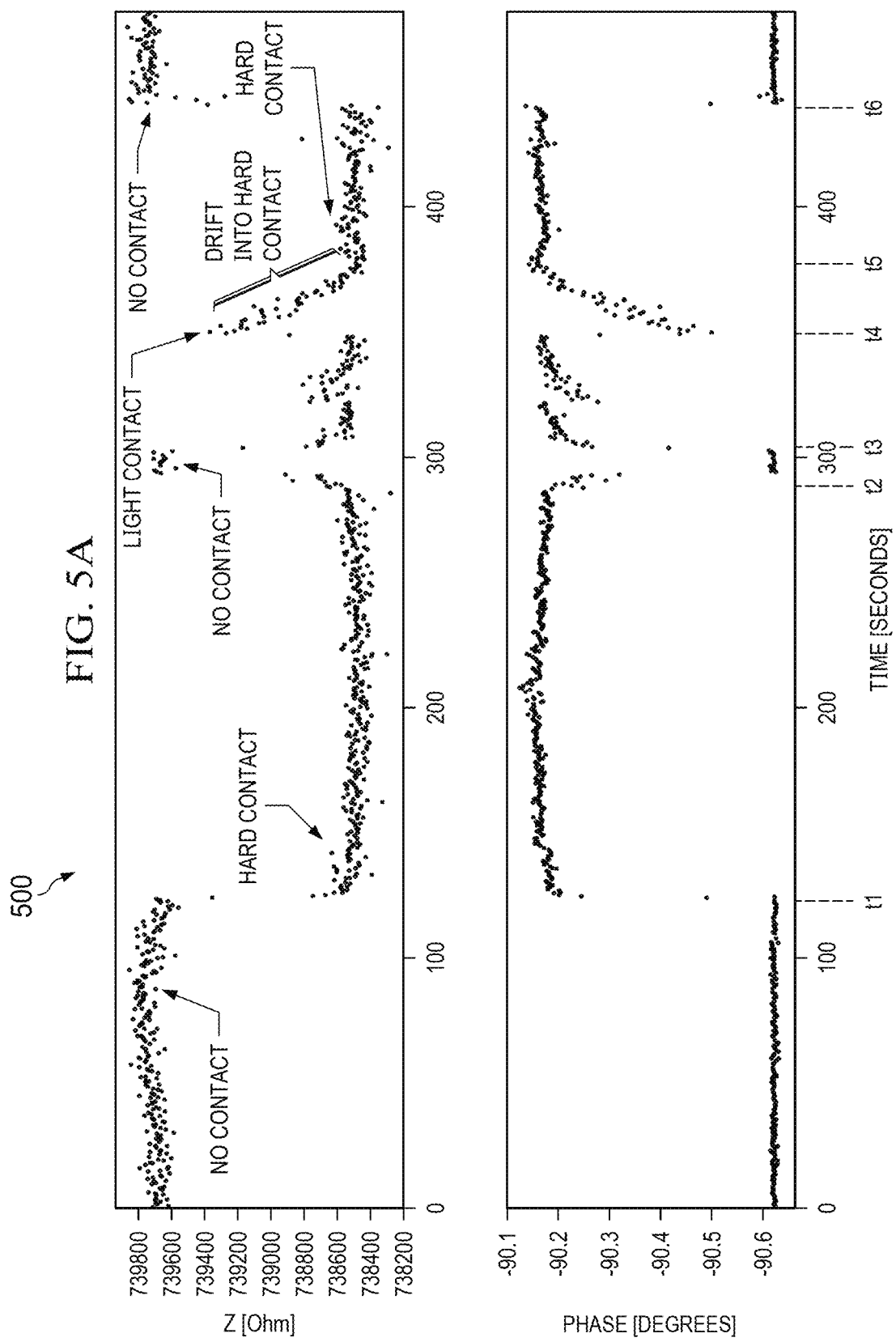

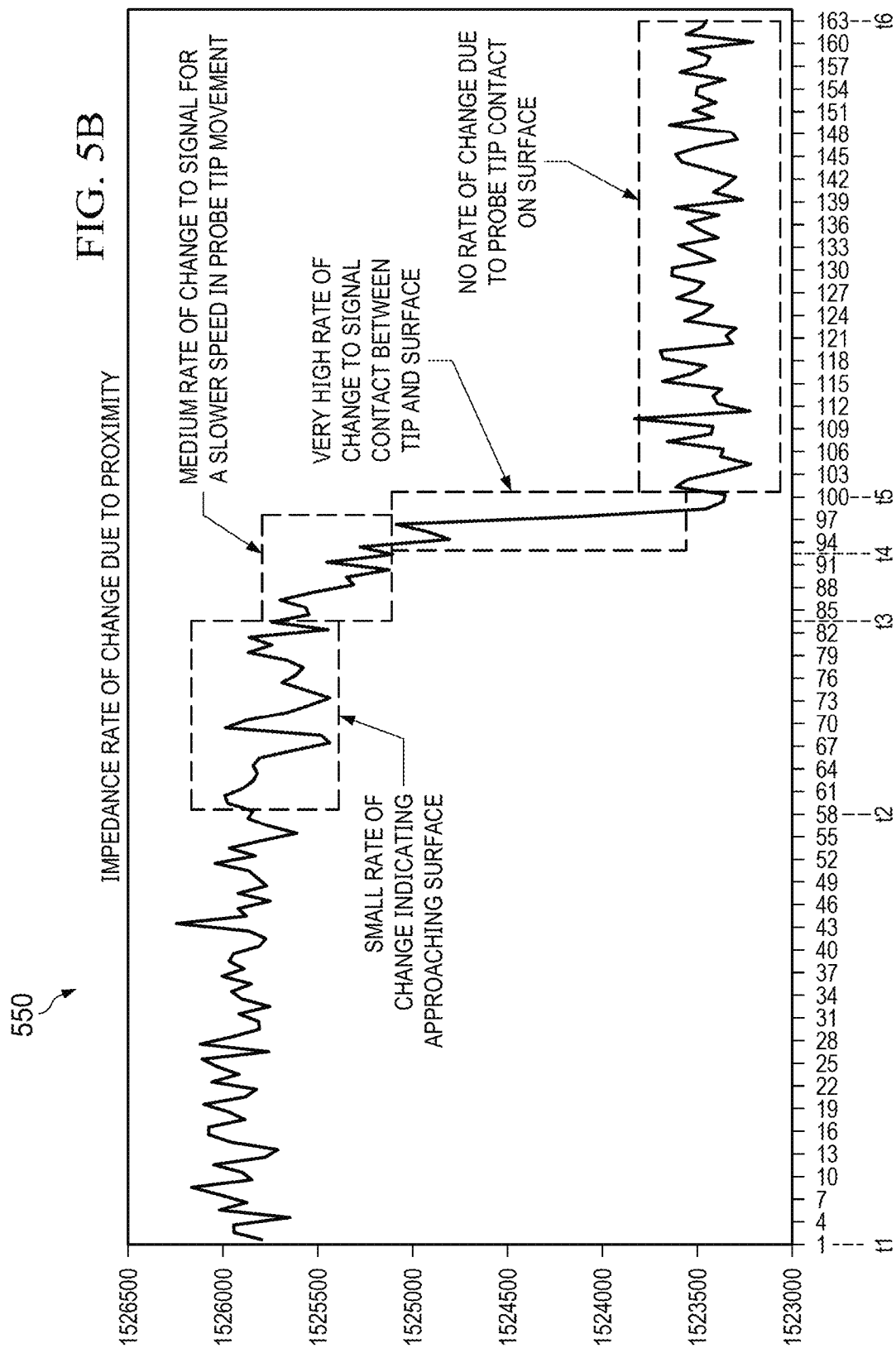

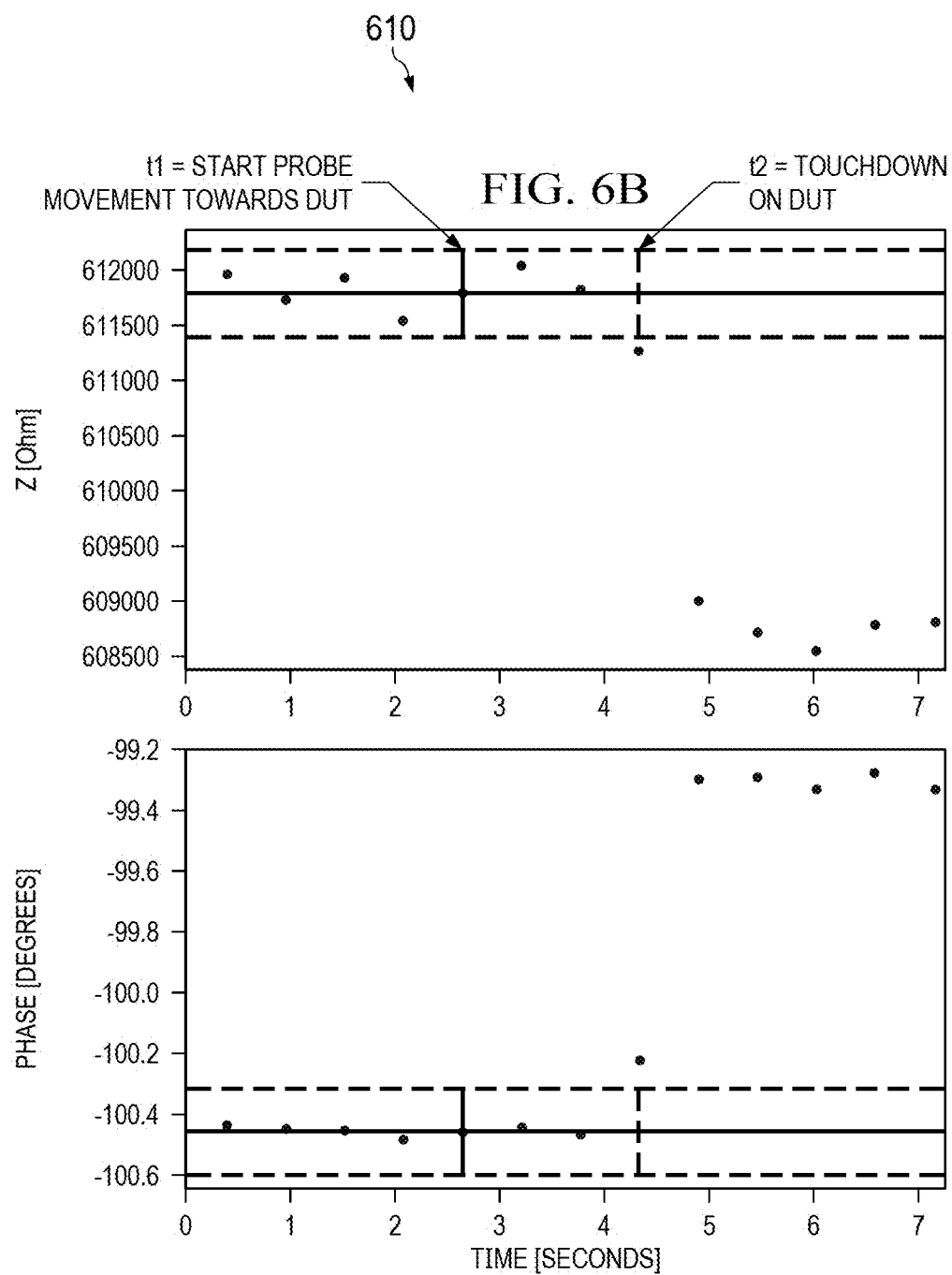

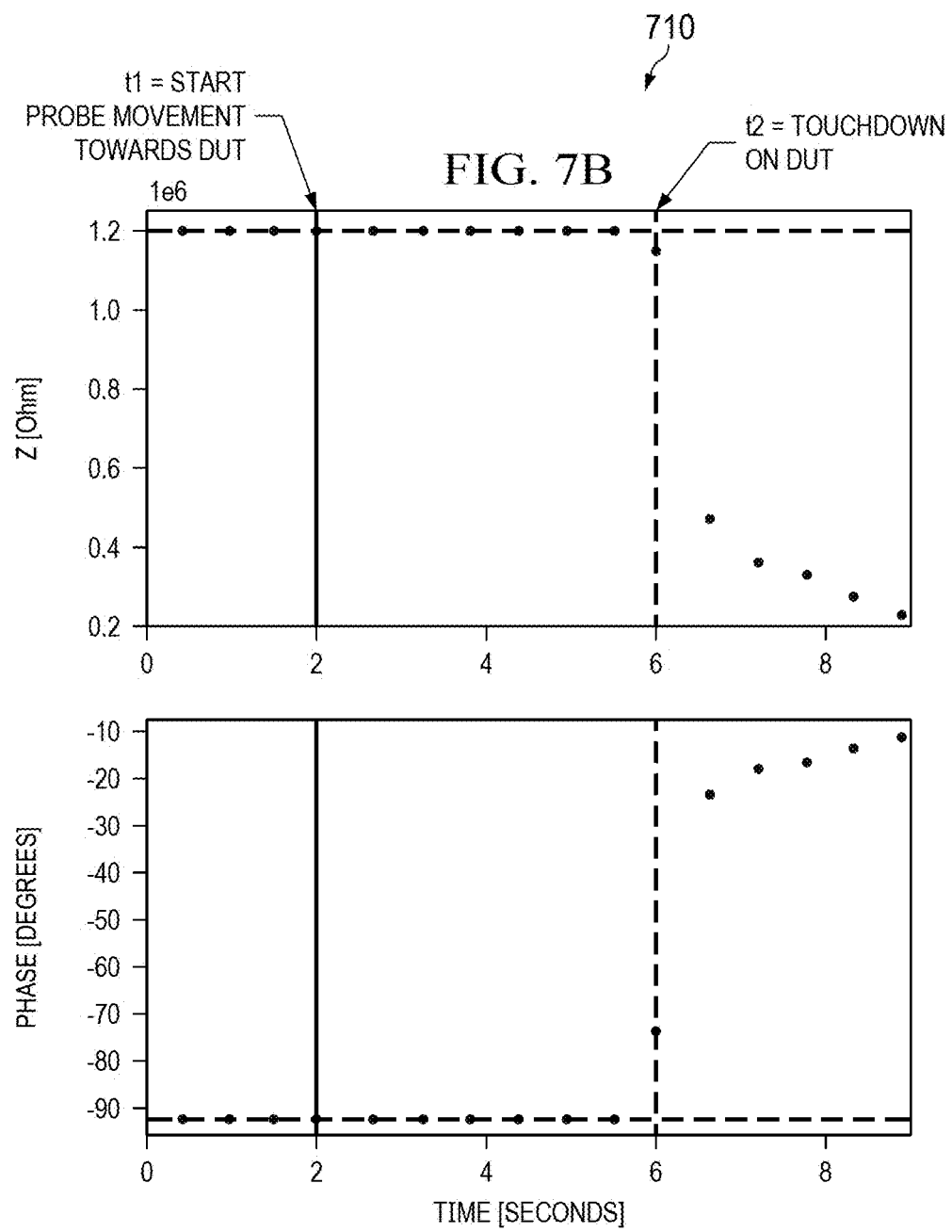

AUTOMATED PROBE LANDING

CROSS REFERENCE TO RELATED PATENT APPLICATIONS

This application claims the benefit of U.S. Provisional Application No. 63/267,983, filed Feb. 14, 2022, the entire contents of which are incorporated by reference herein.

BACKGROUND

A charged particle beam (CPB) imaging system can be used to examine nanometer scale objects. In general, a CPB imaging system employs a charged particle beam, such as an electron beam, that irradiates an object to visualize the object or features of the object that cannot be visualized using optical microscopes. For example, features that are smaller than the wavelength of light can be visualized using a CPB imaging system.

CPB imaging systems can view details at the atomic level with sub-nanometer resolution (e.g., down to about 0.1 nm resolution) at a magnification of up to about one million. CPB imaging systems include scanning electron microscopes (SEM), focused ion beam (FIB) microscopes, and transmission electron microscopes (TEM), among others.

A scanning electron microscope (SEM) is a type of CPB imaging system. In an example SEM, a beam of electrons is scanned over the surface of the object. Detectors collect the backscattered, absorbed, and/or secondary electrons reflected, absorbed, or from the surface of the object and convert the collected electrons into a signal that is used to produce a real-time, multi-dimensional visualization of the specimen.

Semiconductor processing has achieved single digit nanometer feature sizes (e.g., 5 nm feature sizes). Manual probing in situ to a CPB system has been demonstrated as a reliable technique to test semiconductor devices that include single digit nanometer feature sizes, but is labor intensive and has low throughput. Automating the probing process will increase the number of devices that can be tested and free up tool users to be more effective in other areas of their work. A major component of automated probing is automated landing. The present disclosure focuses on solving the problems of how to automate probe landing.

SUMMARY

Aspects of the embodiments include an automated method for landing a probe onto a device under test (DUT), the method including positioning, by an automated motion control system, a conductive probe above the DUT; applying, by signal measurement circuitry, electrical signals between the conductive probe and the DUT; measuring, by signal measurement circuitry, electrical responses from the applied electrical signal; calculating, by a processor, impedance magnitude values and/or phase angle values based on the measured electrical response values; causing, by the automated motion control system, the conductive probe to move towards the DUT while continuing to calculate impedance magnitude values and/or phase angle values from measured electrical response; determining, by the processor, that the conductive probe has contacted the DUT based on a change in the calculated impedance magnitude values and/or phase angle values; and signaling, by the processor, to the automated motion control system to stop moving the probe towards the DUT based on the change in the calculated impedance magnitude values and/or phase angle values. The motion control device can automatically stop the probe based on receiving the signal from the processor, which indicates that the probe has contacted the surface, such indication based on impedance and/or phase determinations.

In some embodiments, determining that the conductive probe has contacted the DUT based on a change in calculated impedance magnitude values and/or phase angle values comprises determining, by the processor, a change in a rate of change of the calculated impedance magnitude value and/or phase angle value.

In some embodiments, the change in the calculated impedance magnitude values and/or phase angle values comprises a value, or average of values, changing a predetermined amount from a baseline or meeting/crossing an absolute value.

In some embodiments, the change in the calculated impedance magnitude values and/or phase angle values comprises a noise measurement, frequency or profile changing from a baseline or meeting/crossing an absolute measurement, frequency or profile.

In some embodiments, the change in the calculated impedance magnitude values and/or phase angle values comprises a rate of change changing a predetermined amount from a baseline or meeting/crossing an absolute rate of change.

Some embodiments can also include performing an electrical test on the DUT.

Some embodiments can also include determining that the electrical test of the DUT is completed; signaling to the motion control device to separate the conductive probe from the DUT; and determining, by a processor, that the conductive probe has separated from the DUT based on the aforementioned change in the calculated impedance magnitude values and/or phase angle values.

Some embodiments can also include determining, based on a test plan, a second DUT to be tested; and signaling to the motion control device to position the conductive probe over the second DUT.

In some embodiments, causing the conductive probe to be positioned over the second DUT includes identifying coordinates of the second DUT; and causing the conductive probe to position over the second DUT based on the coordinates of the second DUT.

In some embodiments, causing the conductive probe to be positioned over the second DUT includes identifying coordinates of the second DUT; and causing the second DUT to be positioned under the conductive probe based on a translation of the coordinates of the second DUT.

Some embodiments can also include determining, from a received impedance magnitude values and/or phase angle values, a type of the DUT based, at least in part, on a comparison of calculated impedance magnitude and phase angle against historic values.

Some embodiments can also include prior to completion of the test of the DUT: stopping the test of the DUT; measuring impedance magnitude values and/or phase angle values; determining that the conductive probe has drifted or moved off of the DUT; repositioning the conductive probe onto the DUT; and completing the test of the DUT.

Some embodiments can also include determining, by a processor, that the impedance magnitude values and/or phase angle values indicate a proximity between the conductive probe and the DUT; and signaling to the motion control device to increase or decrease the rate of motion of the conductive probe towards the DUT based on the proximity between the conductive probe and the DUT determined from the impedance magnitude values and/or the phase angle values.

Some embodiments can also include determining, by a processor, that the impedance magnitude values and/or phase angle values indicate a physical geometry of the conductive probe; determining whether the physical geometry of the conductive probe is suitable to make contact with the DUT based on the impedance magnitude values and/or phase angle values; and signaling to the motion control device to stop and abort the process if the conductive probe does not have a physical geometry to make contact with the DUT, or signaling to the motion control device to continue moving the probe towards the DUT if the conductive probe does have a physical geometry to make contact with the DUT.

Aspects of the embodiments include a system that includes a nanoprober comprising an actuator and to secure a conductive probe; a signal measurement circuit electrically coupled to the conductive probe, the signal measurement circuit to apply a signal to the conductive probe and receive a signal from the sample or apply signal to the sample and receive signal from probe, a motion control system to move the nanoprober actuator based on information received from the signal measurement circuitry; and a hardware processor to determine that information from the signal measurement circuitry indicates proximity of the conductive probe to a desired surface, and determine that information from the signal measurement circuitry indicates fitness or quality of the conductive probe, and determine that information from the signal measurement circuitry indicates that the conductive probe has landed on a desired surface, and signal to the motion control system to stop moving the nanoprober positioner based on the indication that the conductive probe has landed on the desired surface.

In some embodiments, the motion control system is to lower the conductive probe towards the DUT while the signal measurement circuitry receives electrical information and the processor calculates impedance magnitude and phase angle between voltage and current based on the received electrical information.

In some embodiments, the processor is to determine that the impedance magnitude or phase angle between voltage and current value received represents the conductive probe tip proximity to the DUT; and signal to the motion control system to change the probes rate of movement, based on proximity, towards the DUT.

In some embodiments, the processor is to determine that the impedance magnitude or phase angle between voltage and current value received indicates an unusable probe tip to land on the DUT; and signal to the motion control system to stop moving the probe towards the DUT and abort the landing.

In some embodiments, the processor is to determine that the impedance magnitude or phase angle between voltage and current value received meets or crosses a threshold value or any other change in behavior from calculated baselines; determine that the conductive probe has contacted the DUT based on the impedance magnitude or phase angle between voltage and current value meeting or crossing the threshold value or any other change in behavior from calculated baselines; and signal to the motion control system to stop moving the probe towards the DUT.

In some embodiments, the processor is to determine what the DUT is based on stored information; and perform an electrical test on the DUT through the signal measurement circuitry based on what the DUT is.

In some embodiments, the processor can determine that the electrical test of the DUT is completed; and signal to the motion control device to lift the conductive probe off of the DUT or to move the DUT away from the conductive probe.

In some embodiments, the processor can determine, based on a test plan, a second DUT to be tested; identify a location of the second DUT; and moving one or both of a sample stage carrying the second DUT and the probe tip so that the probe tip is over the second DUT.

In some embodiments, the processor can identify coordinates of the second DUT; and signal the motion control system to position the conductive probe over the second DUT or signal the motion control system to position the DUT under an origin of a charged particle beam (CPB) device based on the coordinates of the second DUT.

In some embodiments, the processor can identify coordinates of the second DUT; and signal the motion control system to position the conductive probe over the second DUT based on a translation of the coordinates of the second DUT.

In some embodiments, the processor can determine, from a received impedance magnitude values and/or phase angle between voltage and current value, a type of the DUT based on a comparison of the calculated electrical information against historic values.

In some embodiments, the processor, prior to completion of the electrical test of the DUT can stop the electrical test of the DUT; determine, through current received through the signal measurement circuitry, impedance magnitude values and/or phase angle between voltage and current; determine that the conductive probe has drifted or moved off of the DUT; signal the motion control system to reposition the conductive probe onto the DUT; and complete the electrical test of the DUT.

Aspects of the embodiments include a system that includes a nanoprober system securing a conductive probe, a motion control system, a signal measurement circuit to apply a signal to the conductive probe and receive a signal from the sample or apply signal to the sample and receive signal from probe, a motion control system to move the nanoprober positioner based on information received from the signal measurement circuitry; and a hardware processor to positioning a conductive probe above the DUT by a motion control system; applying electrical signals between the conductive probe and the DUT; measuring electrical responses from the applied electrical signal; calculating, by a processor, impedance magnitude values and/or phase angle values based on the measured electrical response values; causing, by the motion control device, the conductive probe to move towards the DUT while continuing to calculate impedance magnitude values and/or phase angle values from measured electrical response; determining, by the processor, that the conductive probe has contacted the DUT based on a change in the calculated impedance magnitude values and/or phase angle values; and signaling, by the processor, to the motion control device to stop moving the probe towards the DUT based on the change in the calculated impedance magnitude values and/or phase angle values.

In some embodiments, determining that the conductive probe has contacted the DUT based on a change in calculated impedance magnitude values and/or phase angle values comprises determining, by the processor, a change in a rate of change of the calculated impedance magnitude value and/or phase angle value.

In some embodiments, the change in the calculated impedance magnitude values and/or phase angle values comprises a value, or average of values, changing a predetermined amount from a baseline or meeting/crossing an absolute value.

In some embodiments, the change in the calculated impedance magnitude values and/or phase angle values comprises a noise measurement, frequency or profile changing from a baseline or meeting/crossing an absolute measurement, frequency or profile.

In some embodiments, the change in the calculated impedance magnitude values and/or phase angle values comprises a rate of change changing a predetermined amount from a baseline or meeting/crossing an absolute rate of change.

Some embodiments can also include performing an electrical test on the DUT.

Some embodiments can also include determining that the electrical test of the DUT is completed; signaling to the motion control device to separate the conductive probe from the DUT; and determining, by a processor, that the conductive probe has separated from the DUT based on the aforementioned change in the calculated impedance magnitude values and/or phase angle values.

Some embodiments can also include determining, based on a test plan, a second DUT to be tested; and signaling to the motion control device to position the conductive probe over the second DUT.

In some embodiments, causing the conductive probe to be positioned over the second DUT includes identifying coordinates of the second DUT; and causing the conductive probe to position over the second DUT based on the coordinates of the second DUT.

In some embodiments, causing the conductive probe to be positioned over the second DUT includes identifying coordinates of the second DUT; and causing the second DUT to be positioned under the conductive probe based on a translation of the coordinates of the second DUT.

Some embodiments can also include determining, from a received impedance magnitude values and/or phase angle values, a type of the DUT based, at least in part, on a comparison of calculated impedance magnitude and phase angle against historic values.

Some embodiments can also include prior to completion of the test of the DUT: stopping the test of the DUT; measuring impedance magnitude values and/or phase angle values; determining that the conductive probe has drifted or moved off of the DUT; repositioning the conductive probe onto the DUT; and completing the test of the DUT.

Some embodiments can also include determining, by a processor, that the impedance magnitude values and/or phase angle values indicate a proximity between the conductive probe and the DUT; and signaling to the motion control device to increase or decrease the rate of motion of the conductive probe towards the DUT based on the proximity between the conductive probe and the DUT determined from the impedance magnitude values and/or the phase angle values.

Some embodiments can also include determining, by a processor, that the impedance magnitude values and/or phase angle values indicate a physical geometry of the conductive probe; determining whether the physical geometry of the conductive probe is suitable to make contact with the DUT based on the impedance magnitude values and/or phase angle values; and signaling to the motion control device to stop and abort the process if the conductive probe does not have a physical geometry to make contact with the DUT, or signaling to the motion control device to continue moving the probe towards the DUT if the conductive probe does have a physical geometry to make contact with the DUT.

BRIEF DESCRIPTION OF THE DRAWINGS

FIG. 5A is a graphical representation of calculated impedance magnitude and phase angle corresponding to probe positions relative to a device under test in accordance with embodiments of the present disclosure.

FIG. 5B is a graphical representation illustrating how rates of change of calculated impedance magnitude indicates probe tip location relative to a surface of a device under test in accordance with embodiments of the present disclosure.

FIGS. 6A-D are images and graphs depicting n-type metal oxide semiconductor (NMOS) device source probe landing and testing in accordance with embodiments of the present disclosure.

FIGS. 7A-D are images and graphs depicting p-type metal oxide semiconductor (PMOS) device source probe landing and testing in accordance with embodiments of the present disclosure.

Figures not drawn to scale, unless indicated.

DETAILED DESCRIPTION

Figure 1A:
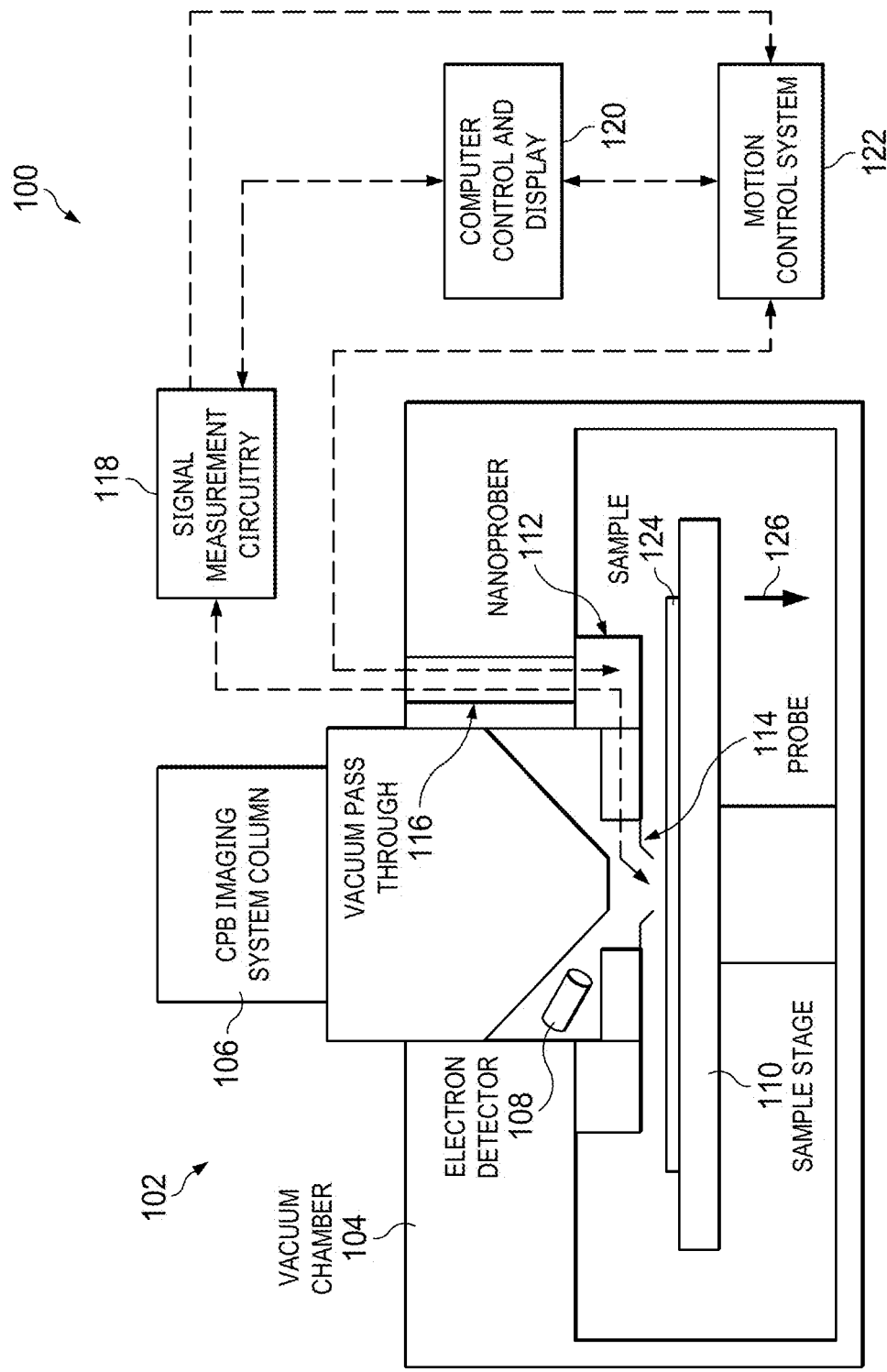
FIGS. 1A-1B are schematic diagrams of components in systems that have automated probe landing in accordance with embodiments of the present disclosure.
Figure 1B:
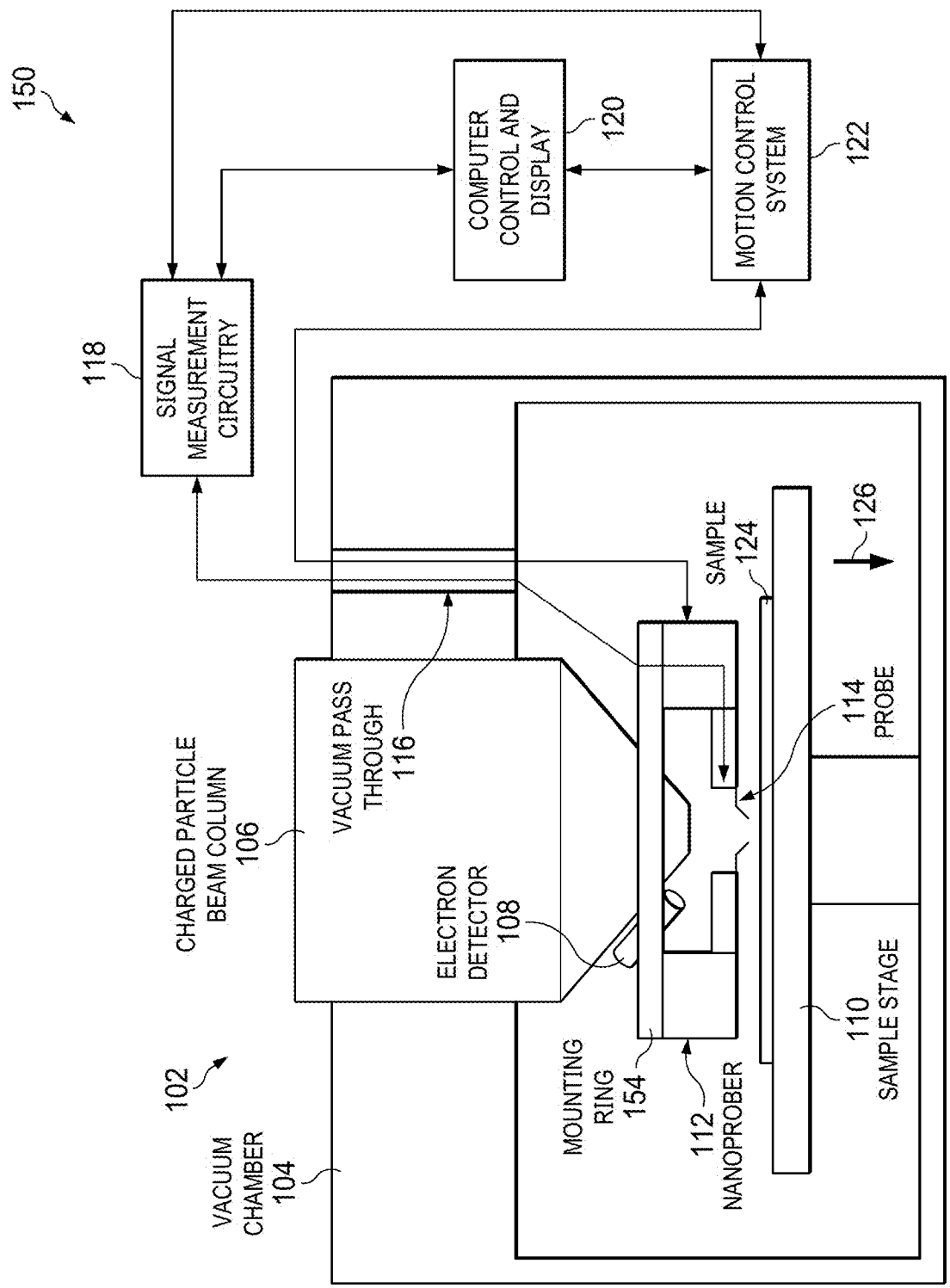

FIGS. 1A-1B are schematic diagrams of charged particle beam imaging systems that include nanoprobers and measurement and control circuitry in accordance with embodiments of the present disclosure. FIG. 1A shows the nanoprobers coupled to a ceiling surface of the vacuum chamber, while FIG. 1B shows the nanoprobers coupled to a mounting ring that is attached to the CPB column. The systems of FIGS. 1A and 1B include a charged particle beam imaging system that contains nanoprobers and measurement and control circuitry in accordance with embodiments of the present disclosure.

FIG. 1A illustrates a first example embodiment of an automated probe landing system 100 and a charged particle beam system 102 in accordance with embodiments of the present disclosure. CPB system 102 can be a scanning electron microscope, focused ion beam system, combination of SEM and FIB, or other type of CPB system for imaging micrometer and nanometer scale structures. The CPB system 102 includes a vacuum chamber 104. CPB system 102 can include seals, pumps, and other equipment to create a vacuum within the vacuum chamber. The CPB system 102 includes a CPB imaging column 106. CPB imaging column 106 can emit charged particle beams, such as electron beams, positron beams, or focused ion beams towards a target. The CPB system 102 includes an electron detector 108 for detecting electrons as part of the imaging process. Within the vacuum chamber 104 is a sample stage 110 for holding a sample 124. Sample stage 110 can be controllable and trainable to move automatically to position a device under test (DUT) under the CPB imaging column 106. Put differently, sample stage 110 is an encoded sample stage 110. Sample stage 110 is also electrically connected to the external electronic systems, so that the sample stage 110 can act as an electrical return or electrical ground, or can be biased. Sample stage 110 can include a return line 126 that can serve as an electrical neutral line or a ground line. The return line 126 can complete a circuit between the conductive probe and the DUT so that voltage applied to the DUT with the probe can cause current to flow back to the signal measurement circuitry through the return line 126.

A DUT can be a circuit element, such as a resistor or transistor; or a DUT can be a landing pad or contact pad or other electrode for a circuit element, such as a transistor source or transistor drain contact. Other landing areas for making electrical contact to devices or materials on the chip can be referred to as DUT.

The automated probe landing system 100 includes one or more nanoprobers 112. A nanoprober 112 can include any device capable of nanometer or better (i.e., sub-nanometer) resolution motion. The nanoprober 112 can carry one or more probes 114. A probe 114 can be a metal wire (e.g., tungsten wire) that includes a tapered end, such as those used for scanning tunneling microscopy or any other conductive material.

Nanoprober 112 or a plurality of nanoprobers (as shown) may be used inside the CPB imaging system 102 to acquire additional information about a sample. Each nanoprober 112 can be controlled by a motion control system 122. The nanoprober 112 is electrically connected to a motion control system 122 through a vacuum pass-through 116, such as through a sidewall of the vacuum chamber or through a door of the vacuum chamber. In the embodiment shown in FIG. 1A, the nanoprober 112 can be secured to the ceiling of the vacuum chamber 104. Typically, vacuum chambers 104 for CPB systems are large, heavy pieces of equipment, which makes them mechanically stable. Securing the nanoprober 112 to the ceiling of the vacuum chamber 104 can provide mechanical stability to the nanoprobers.

Turning briefly to FIG. 1B, FIG. 1B is a schematic diagram of the second embodiment of an automated probe landing system 150 and a charged particle beam system 102 in accordance with embodiments of the present disclosure. The automated probe landing system 150 is similar to automated probe landing system 100 described herein, but includes a mounting ring 154. Mounting ring 154 can be secured to the CPB column or surround the CPB column and be secured to the ceiling of the vacuum chamber 104. The nanoprober(s) 112 can be secured to the mounting ring 154. The benefit of a mounting ring 154 is that no mounting holes need to be drilled into the vacuum chamber 104, which can create vacuum pressure issues. Instead, the mounting ring 154 can be fixedly secured using brackets or other mechanisms to the CPB column 106. An additional advantage to the mounting ring 154 is that the mounting ring 154 can be structured so that the center of the mounting ring 154 is coaxial with the CPB column 106. The mounting ring 154 can secure nanoprobers 112 to known and fixed locations around an origin that is coaxial to the CPB column and coaxial with the charged particle beam itself.

Returning to FIG. 1A, the motion control system 122 can be directly coupled to the nanoprober 112 or can be connected to the nanoprober through intermediate electronics, such as through a computer system 120. The motion control system 122 can be any type of control system that can provide electrical signals to the nanoprober to cause the nanoprober 112 to move or to cause the probe 114 to move. Motion control system 122 can cause the nanoprober 112 to move or cause the probe 114 to move in an automated matter (i.e., without operator input). The motion control system 122 and/or computer 120 can include software or firmware that are embodied on non-transitory media. The software or firmware can include instructions that when executed cause the motion control system 122 to operate the nanoprober 112 to move the probe in one or more directions. For example, the motion control system 122 can be responsive to electrical information received from probe 114 indicating that the probe has landed on the surface of a DUT and can stop moving the probe towards the DUT. Motion control system 122 can also be responsive to the completion of a test to move the probe up and away from the DUT.

The automated probe landing system 100 also includes signal measurement circuitry 118. Signal measurement circuitry 118 can include circuitry to apply electrical signals to the probe 114 and to receive electrical signals from a sample through the probe 114. Signal measurement circuitry 118 can also receive signals through return line 126. The signal measurement circuitry 118 can communicate with the probe 114 through vacuum pass-through 116. Signal measurement circuitry 118 can provide signals to computer 120 and/or motion control system 122. For example, raw data from the probe 114 can be routed through signal measurement circuitry 118 to a computer 120 that can calculate impedance magnitude values and/or phase angle between voltage and current (for ease of the description, phase angle between voltage and current will be referred to simply as "phase angle"). Impedance and/or phase angle can also be calculated by signal measurement circuitry 118 without deviating from the scope of the disclosure. Signal measurement circuitry 118 can also provide signals to the motion control system 122, which can use signals from signal measurement circuitry 118 to automatically control the nanoprober 112.

Each of signal measurement circuitry 118 and motion control system 122 can be individual hardware units or can be packaged into a single unit, such as part of computer 120. Any combination of packaging the signal measurement circuitry 118, motion control system 122, and computer 120 is contemplated by this disclosure. In addition, though not shown, one or both of signal measurement circuit 118 or the motion control system 122 can be implemented using circuitry that reside on or with or proximate to nanoprober 112. The nanoprober 112 can also be powered using a battery or other modular power source. Such implementation choices reduce the number of external cables that are used for signal measurement, nanoprober control, and power delivery.

Computer 120 can include one or more hardware processors, memory, storage, and peripheral components, including user interface components such as a mouse, keyboard, monitor, joystick, or other type of user interface. The computer 120 can include software to allow an operator to control the CPB system 102. The monitor can be used to view images created by the CPB system 102, including real-time imaging of the nanoprober 112 operation. The computer 120 can include hardware and software to perform signal measurements, signal calculations, perform tests, automate the nanoprober, store information, and perform other tasks associated with automated probe movement and landing and device testing. The computer 120 can include signal measurement circuitry and motion control hardware and software, as described herein.

Figure 2:
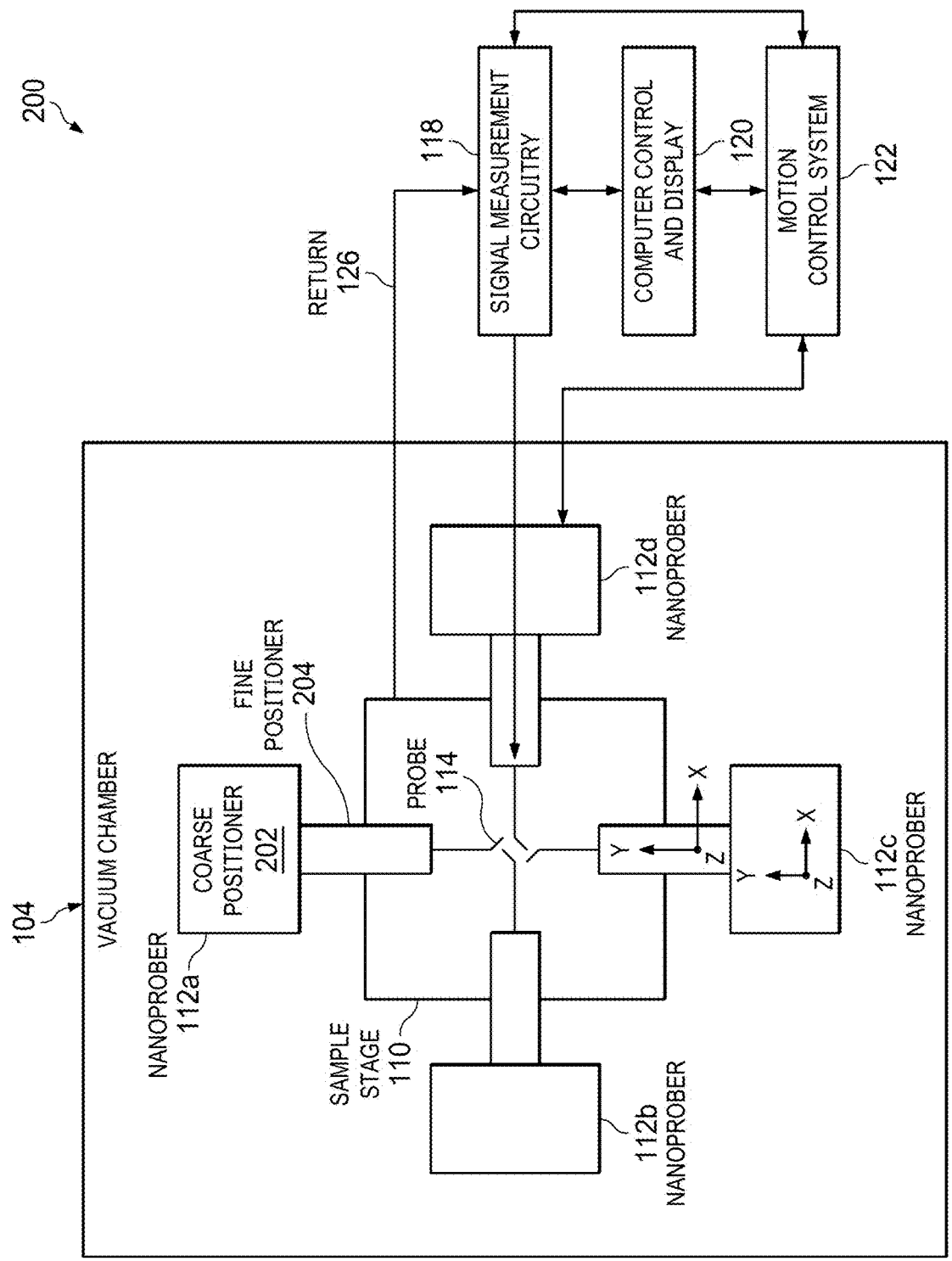
FIG. 2 is a schematic diagram of a top-down view of four nanoprobers above a sample stage within a vacuum chamber of a charged particle beam imaging system in accordance with embodiments of the present disclosure.

FIG. 2 is a schematic diagram of a top-down view of four nanoprobers above a sample stage within a vacuum chamber of a charged particle beam imaging system in accordance with embodiments of the present disclosure. FIG. 2 shows a top-down view of the automated probe landing system of FIGS. 1A or 1B. The automated probe landing system includes four nanoprobers 112a-d. Each nanoprober 112a-d includes a coarse positioner 202 and a fine positioner 204. Each of coarse positioner 202 and fine positioner 204 can be controlled by motion control system 122. Motion control system 122 can control the coarse positioner 202 and fine positioner 204 to move in the X-, Y-, or z-directions. (One of skill in the art would know that other coordinate systems can be used, such as polar coordinates, to described physical space and movement within physical space.)

As shown in FIG. 2, the nanoprober includes coarse movement in the X, Y, and Z directions. The coarse movement can be performed using actuators. The nanoprober also includes fine movement in the X, Y, and Z directions. The fine movement can be performed using piezoelectric materials. Other mechanisms for coarse and fine movement can be used, as long as each is vacuum compatible and achieves the desired movement resolution.

In embodiments, the motion control system 122 can be manually operated. When manually operated, an operator provides control instructions or signals to the nanoprober via a control interface, such as a joystick, mouse, keyboard, smart-device, or other interface. The motion control system can convert the operator's signals into electrical signals that actuate the fine or coarse movement of the nanoprober.

Nanoprobing systems that reside within a CPB imaging system have relied on a human for controlling the position of each probe. An operator visually watching a live (e.g., SEM) image on a display moves the probe using software control or a hardware controller. This type of control is "open-loop," with the targeting being completed by the operator. In essence the operator sees the contact point target in the CPB imaging system image and sees the probe tip in the same image. The operator then provides input to the control software using a joystick, mouse motion, or any other controller to move the probe to come into contact with the target point.

Manual probing for in situ testing of semiconductor devices is a time- and labor-intensive process. This disclosure describes systems and devices for automating the probe landing procedure so that in situ testing of single digit nanometer features sizes can be achieved without manual operation of a probing device.

A nanoprobing system residing within a CPB imaging system, as shown in FIGS. 1-2 can apply an electrical signal to a probe. The nanoprobing system can measure an electrical response during probe landing and lifting procedures and perform device testing. For example, the nanoprobing system can apply a voltage and measure current (or apply a current and measure a voltage) during a probe landing procedure. The resulting impedance magnitude measurements and impedance phase angle measurements can be used to determine a probe's height from a surface target and can be used to determine whether a probe has landed on target. Automation of the probe landing (and device testing) procedure can be achieved by using closed-loop designs and can reduce labor costs while increasing throughput (or decreasing time). Automation can also facilitate the testing of a greater number of devices on a single chip in less time, and also facilitate the testing of a greater number of chips overall.

Figure 3A:
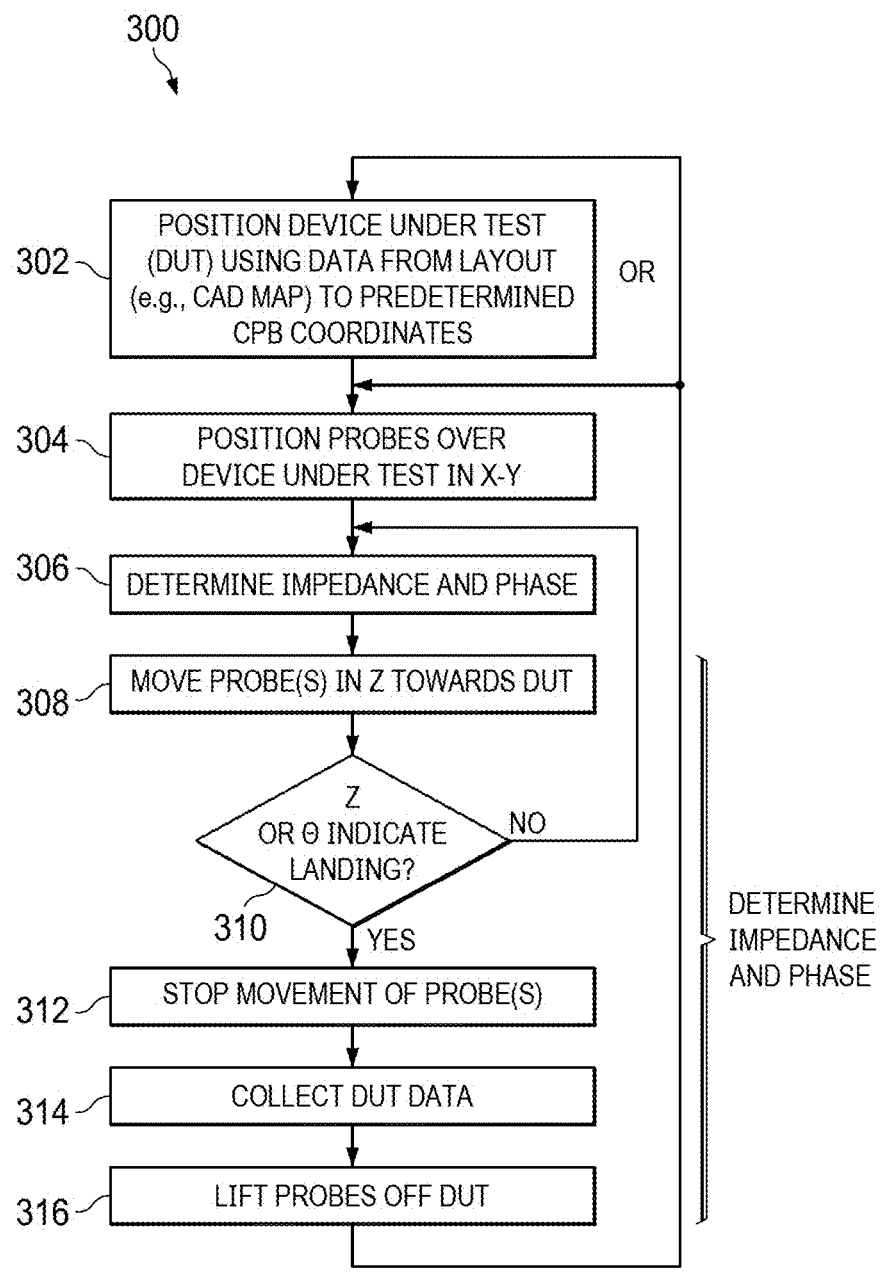
FIG. 3A is a process flow diagram for landing a probe on a device and testing the device in accordance with embodiments of the present disclosure.

FIG. 3A is a high level process flow for automated landing of a probe on a device and testing the device in accordance with embodiments of the present disclosure. It is understood that embodiments for automated probe landing and device testing can be performed within a CPB imaging system under vacuum conditions. However, automation of probe landing and device testing can be performed in any environment without deviating from the scope of this disclosure. It also understood that the landing process is automated. One or more method operations are performed by one or a combination of a computer system, signal measurement system, motion control device, and a nanoprober apparatus.

In FIG. 3A, at the outset, a device under test (DUT) can be moved to a predetermined position within the vacuum chamber. (302). For example, a sample stage supporting a chip that includes the DUT can be positioned so that the DUT is positioned at a predetermined location within the CPB chamber. The predetermined location can be known or determined from CAD layout information. For example, the chip on which the DUT has been fabricated can have a corresponding CAD map that includes coordinate or location values for each device on the chip. This information can be used by the automated system to position the sample stage at a predetermined location. This predetermined location can be an "origin" of the CPB coordinate system, which can coincide with the CPB. In embodiments, the predetermined location can be any location within range of one or both of the scanning range of the CPB or the positional range of the nanoprobing system.

The nanoprobing system can also have a coordinate system. This coordinate system can be mapped onto the coordinate system of the CPB system, so that the position of the probes and the position of the DUT are transposed onto a common coordinate system. This transposition is beyond the scope of this disclosure. The nanoprober system can position a conductive probe in the X and Y directions over the DUT. (304). For example, the control system can use coordinate system mappings to move the probe tips into a predetermined position in the X and Y direction, so that the conductive probe is over the DUT.

Before lowering the probe in z towards the DUT, and during the landing process, impedance magnitude values and/or phase angle measurements can be performed. (306). Impedance magnitude and phase angle measurements are calculated by measuring current. Voltage is applied across the probe and current is measured between the probe and the sample stage. Impedance can include resistance and/or capacitance values. The probe is moved towards the DUT. One of skill in the art would know that current can be applied and voltage measured; and impedance magnitude and phase angle measurements can be calculated from the measured voltage.

As the probe is moved towards the DUT, impedance magnitude and phase angle values are calculated and monitored for information about proximity between the probe tip and the contact location. As the tip gets closer to the contact location, the rate of change of the impedance measurement values begins to increase. The detection of the increase in the rate of change of the impedance measurement value can be used to control the rate of motion of the probe tip towards the contact location.

When the distance between the probe tip and the DUT is large, the rate of change of impedance magnitude and phase angle is relatively small (e.g., no change is observed or the observed rate of change is slow). An increase in the rate of change of the impedance magnitude values and/or phase angle indicates to the probing system that the probe is nearing the DUT surface. The rate of change of the impedance magnitude values and/or phase angle values can be used to control the direction of motion of the probe tip. For example, the motion control system can move the probe tip towards the DUT surface while no change in rate of change in impedance magnitude and/or phase angle values are observed. The motion control system can stop the motion of the probe tip when a rapid change in the rate of change of the impedance magnitude values and/or phase angle values is observed.

In addition, the motion control system can control the speed of the probe tips based on the observed rate of change of the impedance magnitude and/or phase angle values. For example, the motion control system can move the probe tips quickly towards the DUT surface when little to no change in the rate of change of impedance magnitude and/or phase angle values is observed. The motion control system can then slow the speed of the probe tip's motion toward the DUT surface when a certain change in the rate of change of the impedance magnitude values and/or phase angle values is observed. By slowing the probe tip, the surface landing can be gentle, which preserves the integrity of the probe tip and of the DUT surface.

The impedance values are also monitored for information about the fitness or quality of the probe tip to make contact with the sample. As the probe tip moves closer to the contact location, the overall background trend of the impedance values indicate the shape of the conductive probe tip where a very flat or constant background trend indicates a sharp tip with a very small tip radius. If the background is less constant and has a slight slope, it could indicate that the conductive probe tip has a large tip radius, and if the background has a larger slope it could indicate that the probe is landing with its contact point further up the probe from the tip, where the probe tip is bent away from the sample. In the last two situations, the automated probe landing sequence could decide that the probe is unfit for use and abort the landing process, warning the operator that the probe should be changed or replaced.

When the impedance magnitude values and/or phase angle values value exhibits a change, the probe is determined to have landed, and the control system stops the probe. The change can be the impedance components measuring a value, or running average, that changes from a taken baseline or that meets/crosses a set absolute value. The change can also be other behaviors of the electrical signal, such as a change in the measured noise or the frequency of noise.

In one non-limiting example, threshold values can be used by the control system for determining probe landing and to control the motion of the probe tip. For example, non-contact electrical response can result in a first impedance magnitude value $Z1$ and first impedance phase angle value $\theta 1$. The electrical response after the probe lands on the surface of the DUT can result in second magnitude $Z2$ and second phase angle $\theta 2$. A threshold magnitude $Zt$ for landing can be defined as $Z1>Zt>Z2$. A threshold phase angle $\theta t$ for landing can be defined as $\theta 2>\theta t>\theta 1$. Multiple threshold values can be established to define soft versus hard contact on the surface. The threshold magnitude $Zsc$ for soft landing and the threshold magnitude $Zhc$ can be defined as $Z1>Zsc>Zhc$, where $Z2$ can represent either a soft or hard landing, depending on the value of $Z2$ and the threshold values $Zsc$ and $Zhc$. The threshold phase angle $\theta sc$ for soft landing and the threshold phase angle for hard landing $\theta hc$ can be defined as $\theta hc>\theta sc>\theta 1$, where $\theta 2$ can represent either a soft or hard landing, depending on the value of $\theta 2$ and the threshold values $\theta sc$ and $\theta hc$. Other thresholds can also be identified and stored. For example, a threshold rate of change of impedance can be determined and stored. The threshold rate of change of impedance can be used to determine whether the rate of change of impedance determined from signal measurements indicates that the probe is nearing the surface of the DUT.

The threshold values can be stored and used during the probe landing procedure. For example, in one example embodiment, a computer can determine and store one or more threshold values for rate of change of impedance. As the nanoprober system continuously measures impedance, the processor can calculate rate of change of measured impedance. The calculated rate of change of impedance can be compared against the threshold rate of change of impedance to make determinations about the probe's proximity to the surface of the DUT as the probe moves towards the surface of the DUT. When the processor determines that the rate of change of impedance is greater than or equal to a first threshold value for the rate of change of impedance, the computer can determine that the probe is within some predetermined distance of the surface and signal to the motion control system to slow the motion of the probe. When the processor determines that the rate of change of impedance is greater than or equal to a second threshold value for the rate of change of impedance, the computer can determine that the probe has contacted the surface and can signal to the motion control system to stop the motion of the probe.

After the DUT is positioned and the probes are positioned in X and Y directions, the probe can be manually or automatically lowered in z towards the DUT. (308). Notably, the symbol Z is used for both impedance and directionality. For clarity, a lowercase z is used to denote directionality. The z direction is orthogonal to the X and Y directions of a Cartesian coordinate system, and in this case, the z direction is towards or away from the sample stage. The coordinate system is shown in FIG. 2. The control system can apply a ramped control signal to move the probe in z towards the DUT. In embodiments, at first, the nanoprober can move in large steps to cover relatively large distances. The steps gradually or abruptly become smaller as the probe nears the surface. At a point or after some time, the nanoprober moves the probe in the smallest increments towards the surface as the system performs impedance and phase angle measurements.

As the probe is moved in z towards the DUT, the system can determine whether the resulting impedance magnitude values and/or phase angle values calculations indicate that the probe has landed on the DUT surface. (310). If the probe has landed, a stop signal is sent to the control system to stop the motion of the probe. In some embodiments, it may be beneficial to verify ohmic contact prior to taking test data. The probe can be lifted and relanded (again, using impedance magnitude and phase angle calculations). The probe can also be moved in z further towards the DUT after the impedance magnitude values and/or phase angle values calculations indicate probe landing, to ensure ohmic contact is reached.

The DUT is tested and data is collected (314). In embodiments, part of the probe landing and testing automation includes training the system to recognize good DUT test results. The training can also be used to differentiate between a defective DUT and poor or failed probe contact on the DUT. Since the testing is meant to be performed automatically, and without operator observation, the system can automatically determine whether a test has been performed successfully and whether the test has resulted in a passing or failing DUT.

First, each DUT can have an associated theoretical electrical response. For example, a resistor has a theoretical resistance and would respond to an applied voltage with a predictable current, within some margin for error. The theoretical electrical response can be referred to as a characteristic operational parameter. Each DUT can include a set of one or more characteristic operational parameters against which the observed data can be compared. If the observed data is consistent with the characteristic operational parameters, then the DUT is considered to be passing. If the DUT is considered to be passing, then the system can move onto the next DUT, either by moving the probe, moving the sample, or both.

If the observed data is inconsistent with the characteristic operational parameters, the system can determine whether the DUT has failed or is defective, or whether the probe landing was unsuccessful. A number of implementation specific options are available after a DUT has failed.

In some embodiments, the probe can be lifted and the DUT can be tested again. If the DUT fails again, then the system can log the failure and move to the next DUT. The electrical response of a failed DUT can simply be anything outside of the characteristic operational parameters. Further, the electrical response of a failed DUT might be associated with one or more failure electrical responses. For example, a short circuit of a resistor can produce a failure electrical response IV curve (e.g., vertical line through origin). These failure electrical responses can be used to verify that the DUT has a defect and can be used to determine what that defect is.

These failure electrical responses can also be different from an electrical response from failed probe landing. (A failed probe landing can include a probe that does not land on the DUT or a probe that does not make ohmic contact with the DUT upon landing.) The electrical response observed during the test, therefore, can be used to determine whether the DUT has failed or has a defect or whether the probe tip has not landed properly on the DUT to make a good test.

If the DUT is not the first DUT to have failed, other considerations can be taken into account. An operator can be alerted so that the DUT can be tested manually. The operator can retest the DUT manually to ensure that the probe tip is making contact with the correct DUT and that the test is being performed properly. The operator can retest other DUTs manually to make sure the tests were conducted properly. The operator can also conclude that the sample was bad and start testing a new sample.

The electrical response from the test can be used to determine that the probe did not land properly on the DUT. For example, intermittent signal response or high noise levels can suggest poor ohmic contact to the DUT. Landing on the oxide or other insulating layer can also have a characteristic electrical response (e.g., IV curve) that shows failed landing. Landing on a different circuit component (the wrong DUT) can also produce an electrical response that could so indicate. For example, the IV response from a resistor would be different than the IV response from a transistor. If a probe fails landing, the probe is lifted and the landing process is retried. Noteworthy is that in some cases, probe landing failure can result in damaged probes. In some cases, probe landing failure can result in a different probe being used to retry the landing (e.g., from a different nanoprober within the vacuum chamber). An operator can take an image of the probe to determine if damage has occurred. In some circumstances, the operator can change the probe manually.

Once the DUT testing is complete, the probe is lifted. (316). The probe lifting is automated and is triggered by the completion of the DUT test. E.g., after a certain amount of data is taken, the control system can automatically lift the probe. The probe is lifted a sufficient height away from the chip so that the stage can be moved without the probes inadvertently contacting a feature of the chip. Impedance and phase angle are measured during probe lifting, to ensure sufficient distance from the surface. The process can then restart with the next DUT. In some cases, the next DUT is close to the previous DUT, so the sample stage does not need to move. Instead, the probe is positioned in X and Y. If the next DUT is far enough away, then the sample stage is moved to position the next DUT at a predetermined location.

In cases where a DUT is detected to have a defect, the automated probe lander can perform defect verification by returning to the previous DUT and performing a test on the previous DUT again. If the previous DUT testing has the same or similar results as before, then the defects found at the next DUT would not be attributed to the probe. In some cases, if a defect is detected, the system can alert an operator or log the defect and move on. The operator can choose to visually inspect the DUT, manually land the probe, and perform the testing, to verify the defect. These options are implementation specific.

Figure 3B:
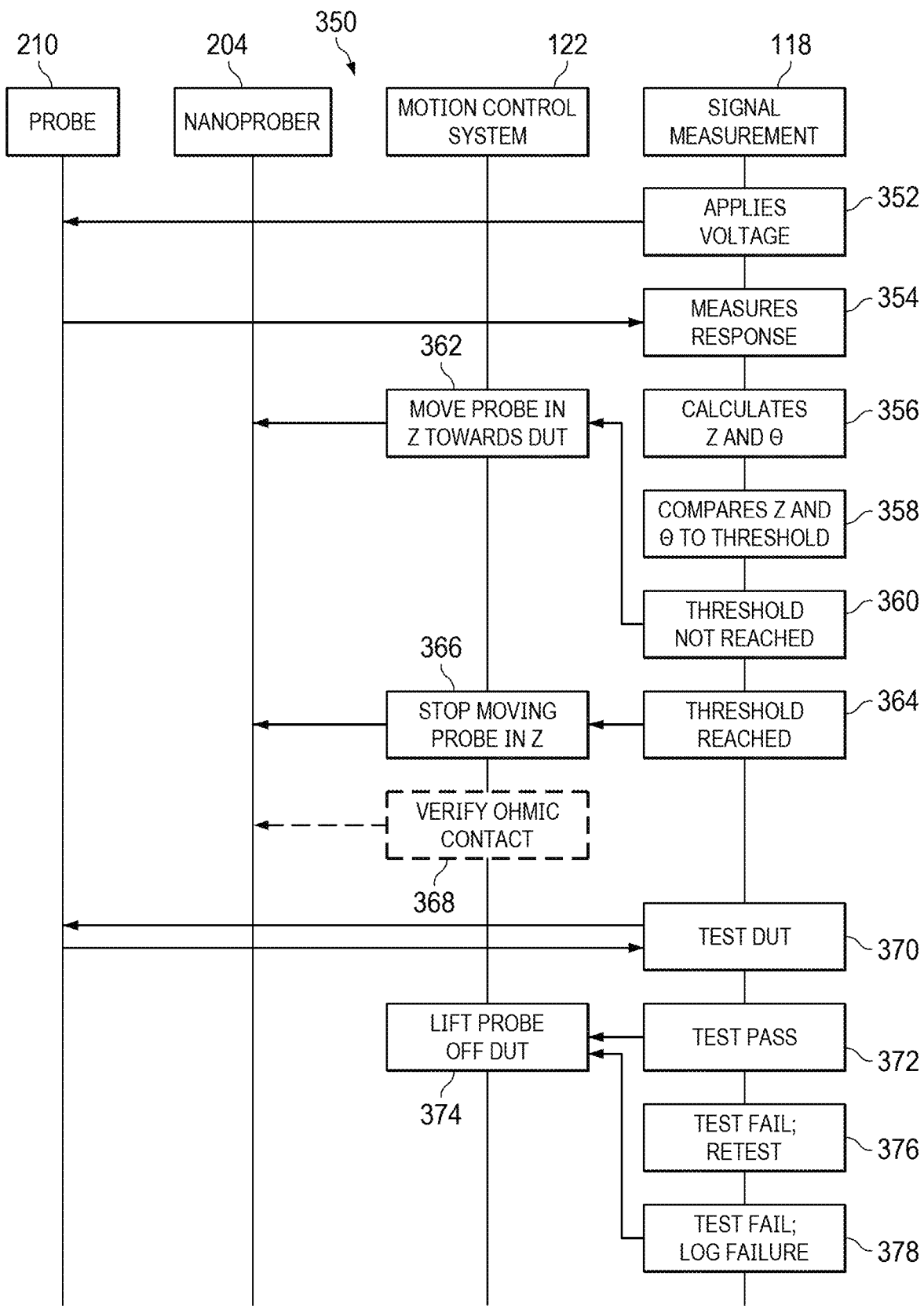
FIG. 3B is a swim lane diagram for a process for probe landing in accordance with embodiments of the present disclosure.

FIG. 3B is a swim lane diagram 350 for a process for probe landing in accordance with embodiments of the present disclosure. The swim lane diagram 350 illustrates signal exchanges between various components of the system. For example, at the outset, signal measurement circuitry 118 can apply a voltage across a conductive probe and the sample stage that supports the DUT. (352). The signal measurement circuitry 118 can measure the electrical response from the DUT. (354). The signal measurement circuitry 118 (or other component that can perform signal analysis and computations) can calculate impedance magnitude values and/or phase angle values from the received electrical response. (356). The calculated impedance magnitude and phase angle values can be compared against threshold values to determine if the probe is nearing the DUT surface or if the probe has landed. This process 352-358 can be performed until the signal measurement circuitry 118 (or other computational component) determines that the probe has landed on the surface. (FIG. 5A shows how impedance magnitude and phase angle change based on the proximity of the probe with the DUT surface.) Threshold values of impedance magnitude and phase angle for defining contact versus non-contact can be predetermined empirically for each type of DUT. Also, threshold magnitude and phase angle values for defining light/soft or intermittent contact can also be predetermined empirically for each type of DUT.

After the signal measurement circuitry begins taking electrical response measurements from the probe, the motion control system 122 can start the z-direction movement of the probe towards the DUT. (362). The motion control system 122 can send a signal to the coarse positioner (e.g., 202) of the nanoprober 112a (or other nanoprober described herein) to move the probe towards the DUT. After a certain number of steps or a certain amount of time, the motion control system 122 can signal the coarse positioner to stop, and can signal the fine positioner to move the probe in the z-direction towards the DUT. The specifics concerning the movement of the probe in z is implementation specific.

The motion control system 122 controls the z-direction motion of the probe based, at least in part, on the electrical response from the probe. The motion control system 122 can continue to move the probe in the z-direction towards the DUT until the electrical response from the probe indicates that the probe has landed. (366). That is, when the calculated impedance magnitude values and/or phase angle values meets or crosses a threshold value. In some cases, the electrical response from the probe can also indicate that the probe is nearly landed or has "softly" landed. (368). A soft landing can be one where the probe has physically contacted the DUT surface but has not established ohmic contact sufficient for conducting electrical tests of the DUT. In those cases, the motion control system 122 can slow the approach so that the probe does not crash onto the surface of the DUT, which risks damaging the probe and/or the surface. In the case of soft landing, the electrical response from the probe can alert the motion control system to slow the z-direction motion or to stop the z-direction motion, and resume z-direction motion at a slower rate. FIG. 5A shows light contact electrical response for both magnitude and phase angle. FIG. 5A also shows how the electrical response can change as the motion control system 122 continues to move the probe in the z-direction after soft-landing is achieved to established a hard (or ohmic) contact with the surface of the DUT.

If the threshold value for impedance magnitude values and/or phase angle values has been met or crossed, the motion control system can be alerted and can stop the z-direction motion probe. (366). The threshold value of impedance magnitude values and/or phase angle values being met or crossed and the resulting cessation of probe motion can trigger the system to begin testing the DUT. (370). The signal measurement circuitry 118 can be responsible for electrical testing of the DUT. The signal measurement circuitry 118 can receive instructions from, e.g., a computer system or controller to perform one or more tests specific for the DUT. For example, based on the CAD map of the chip and a test plan implemented by a controller, the system knows what the DUT is and what types of tests are to be performed on it. The DUT and associated test plan can be stored in a memory and accessed each time a test is to be performed. In addition, test results can also be stored in memory with information associating the test result data with the corresponding DUT.

If the DUT passes the test, (372), the passing test results of the DUT can alert the motion control system to lift the probe off of the surface of the DUT. (374). If the DUT fails the test (376), any number of implementation specific actions can be taken, including a retest (376), a recording of the failure with the DUT (378), a retry of the probe landing as described above, etc. At some point, however, the system moves on from testing the DUT by causing the motion control system 122 to lift the probe off the DUT in the z-direction. (374).

Figure 4:
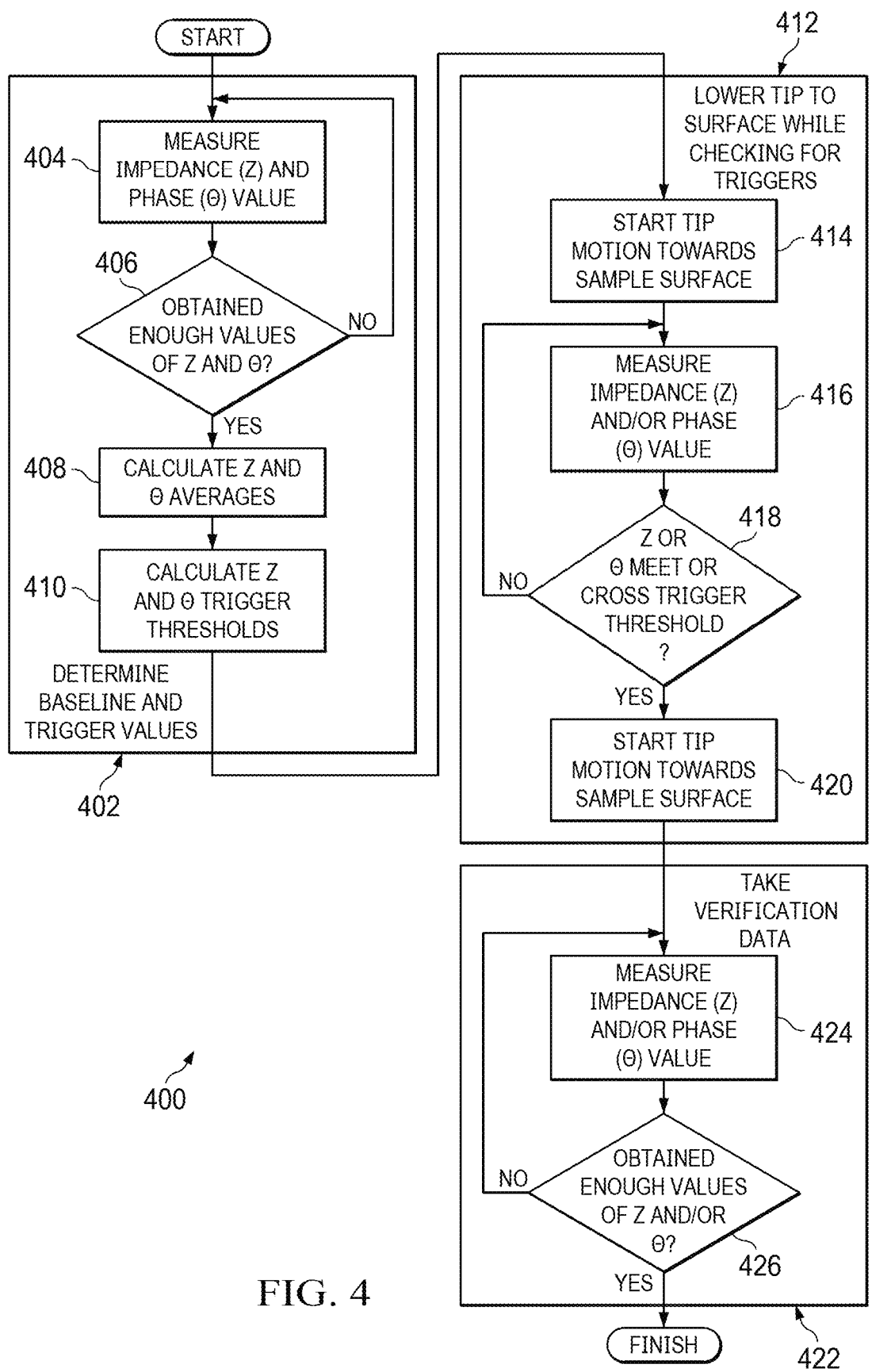
FIG. 4 is a process flow diagram for automated probe landing onto a landing site within a charged particle beam in accordance with embodiments of the present disclosure.

FIG. 4 is a process flow diagram illustrating a process for using impedance magnitude (Z) and phase angle (θ) measurements to determine when a probe has landed on a surface. First, baseline and trigger (or threshold) values can be determined for the device under test (DUT). (402). For example, impedance magnitude and phase angle values can be measured while the probe is off of the sample and after the probe has been manually (or automatically) touched down onto the sample. (404). Sufficient impedance magnitude and phase angle values are calculated for both probe landing and probe lifted scenarios, (406) so that average values can be calculated (408). The amount of data collected for sufficient averaging is implementation specific. Averaging also can be skipped. Baseline values for impedance magnitude and phase angle measurements can be used to determine when the probe is off the sample and when the probe has landed on the sample. (410). The threshold values for a particular DUT can be stored and used later for probe landing and verification. A library of threshold values can be stored as a reference for each device or material.

When a certain device is to be tested, the automated probe lander can either establish a threshold value for that device or can use a stored value as a threshold. In addition, different landing scenarios can be profiled for each DUT. For example, a soft landing electrical response can be profiled so that soft landing baselines and triggers (or thresholds) can be established.

In example embodiments, for any DUT, various electrical data can be collected and recorded during preliminary characterization steps and during real-world operation of the probing system. Example electrical data can include signal to noise ratio (SNR) or SNR standard deviation experienced and measured during probe landings, impedance magnitude and phase angle rates of change, standard deviations of impedance magnitude and phase angle rates of change, impedance magnitude and phase angle, and standard deviation of impedance magnitude signal or standard deviation of phase angle, among other things.

A survey of contact measurements of many DUTs encompassing different DUT variations can be performed and the results recorded. The DUT survey data can be compared to the probing system's signal to noise ratio, for example, or other electrical data. These recorded values of system noise and DUT comparison data can be used to calculate the predetermined amounts that define the sensitivity thresholds or rate of change thresholds that determine that the conductive probe has contacted the DUT.

Other metrics can also be observed or calculated, and used to determine that the probe is approaching the surface, that the probe has landed, that the probe has drifted off of the surface, and that the probe has been damaged. For example, the change in the calculated impedance magnitude and/or impedance can include a value, or average of values, changing a predetermined amount from a baseline or meeting/crossing an absolute value. The change in the calculated impedance magnitude and/or impedance can include a noise measurement, frequency or profile changing from a baseline or meeting/crossing an absolute measurement, frequency or profile. The change in the calculated impedance magnitude and/or impedance can include a rate of change changing a predetermined amount from a baseline or meeting/crossing an absolute rate of change.

A library of electrical information about probe landings can be created for a wide variety of devices. The rates of change of impedance magnitude and phase angle for a DUT can be determined during testing and stored for each device. These values can be used during operation as baselines, benchmarks, triggers, thresholds, etc., that the motion control system uses to determine whether the probe has successfully landed on the surface of a DUT.

Historic data can be collected, updated, and refined over time using data determined during operation of the system and through shared data and through continuous testing. The historic data can also be used to train the motion control system, e.g., using machine learning training algorithms. The motion control system can continuously improve with each successful (and unsuccessful) landing.

For each probe landing onto a specific device, the electrical response information that was observed and calculated for the probe landing can be stored (for both successful and unsuccessful landings). As an example, for a first device, the rate of change of the calculated impedance magnitude and phase angle can be stored. The rate of change information can be used to calculate threshold values or other information for future probe landings on the same or similar devices. The electrical information can be refined over time and for each successful probe landing using, e.g., machine learning techniques or other algorithms. The machine learning techniques or other algorithms can be used to refine thresholds or benchmarks or triggers that are used to control the probe motion during a probe landing for a device. Using historical data to refine expected values, thresholds, benchmarks, etc., for controlling the probe motion can result in an increase in successful landings, thereby speeding up testing, reducing costs, and improving throughput.

Electrical response information from unsuccessful landings can also be used refine the electrical information used for future probe landings on the same or similar devices. For example, electrical information from unsuccessful landings can be used to filter false positives to reduce future unsuccessful landings. The control system can be trained to be cognizant of "bad" data. The control system can stop the motion of the probe prior to landing, reposition the probes, and start over. Or the control system can alert an operator that bad data was detected. In either case, preventing unsuccessful landings can save time and reduce the likelihood of damaging the probe tips or the surface features.

Impedance magnitude and phase angle baselines can be taken to determine a distinction between a soft landing and a hard landing. A soft landing is characterized as a probe making contact with the surface where the contact is light or soft, and impedance is not yet stabilized. Hard contact is characterized as a mechanical push down, where impedance has stabilized. The distinction between soft and hard contact can be used to 1) establish a touch-down point, 2) continue moving the probe towards the target to firmly establish an Ohmic contact with the DUT and 3) prevent a crash landing of the probe that damages the surface or the probe itself. Example electrical measurements for a soft and hard landing are shown in FIG. 5A. The automated probe landing system can use impedance magnitude and phase angle measurements to ensure contact quality, which can result in more reliable DUT electrical testing.

The baseline impedance magnitude and phase angle values can be used as triggers (or thresholds) for the automated system. For example, a threshold magnitude values and/or phase angle values value can be used to determine when the probe controller should stop moving the probe towards the DUT. The baseline values can also be used when assessing probe drift. For example, to the extent that a probe drifts off the DUT, the baseline values can be used to determine that the probe has moved off of the DUT and can be used to reset the probe onto the DUT.

Baseline values can include characteristic operational parameters for the DUT, such as those resulting from a passing electrical test. The baseline values can be unique to certain structures or materials, so the baseline values can be used to verify that a probe has landed on the intended target, as opposed to a different structure on the surface.

Changes in impedance magnitude values and/or phase angle values after landing (on contact) can be used as stability control on contact by constantly monitoring the measurement of magnitude values and/or phase angle values to compensate for drift/creep. Changes in magnitude values and/or phase angle values can also be used as a measurement of contact quality/verification.

In addition, baseline and trigger values can be determined and stored for probe landing onto oxide layers or other surfaces besides the DUTs. This allows the system to have information pertaining to missed landings or failed landings.

Baseline values can also be used to verify that the probe has landed on the DUT, as opposed to somewhere else. Impedance magnitude and phase angle values can be used for structural verification in addition to location verification. For example, a structure with a certain dimension might have a different impedance response than some other structure. Knowledge of the dimensions, composition, and electrical properties of a DUT can be used to establish baseline values for impedance magnitude and phase angle, which can then be use to ensure that the probe has touched down on the correct DUT. FIGS. 6 and 7 show how an NMOS device and a PMOS device have different magnitude and phase angle responses during the landing process.

After the DUT is positioned in a predetermined desired location (e.g., at the CPB origin), the probe can be positioned in X and Y so that the probes are over the DUT. Impedance magnitude and phase angle measurements can begin to be taken at this point, prior to beginning the probe's downward (z) directional movement towards the DUT.

The probe is moved towards the DUT while checking for triggers. (412). The motion control system moves the probe in the z-direction towards the DUT. (414). The signal measurement circuitry can measure electrical response from the probe and calculate impedance magnitude and phase angle to determine whether to continue moving towards the surface or to stop moving. (416). When one or both measured magnitude or phase angle values meets or crosses the threshold established by the baseline measurements, (418) the control system can stop the z movement of the probe. (420).

Verification data can be taken to ensure that the probe is contacting the surface. (422). Verification data collection can include receiving electrical response from the probe after landing and calculating impedance magnitude values and/or phase angle values. (424). Verification data can be taken sufficient times to reliably conclude that the probe has landed on the target surface. (426). If the verification fails, the probe is lifted and the process of landing the probes can be restarted after the X-Y position of the probe is changed. In some embodiments, if verification fails, CPB image data can be taken to visually inspect the position of the probes. This image-based verification is outside the scope of this disclosure.

After it is verified that the probe has landed on the DUT, the DUT testing can begin. Examples of DUT testing are shown in FIGS. 6A-D and 7A-D. FIGS. 6A-D show a process and data for landing a probe and taking DUT measurements for an example NMOS device in accordance with embodiments of the present disclosure. FIGS. 7A-D illustrate landing a different probe and taking DUT measurements for an example PMOS device in accordance with embodiments of the present disclosure.

FIG. 5A is a graphical representation of measured impedance and phase angle corresponding to probe positions relative to a device under test in accordance with embodiments of the present disclosure. Dots on the graph represent values of Z and $\theta$. The Z and $\theta$ measurements can be provided to a control system that can automate the probe landing and movement sequences. FIG. 5 illustrates the impedance magnitude and phase angle changes as the probe moves from above the surface to when the probe touches down onto the surface. FIG. 5 uses samples to take averages of magnitude and phase angle over time. In FIG. 5, between 0 and time t1, the probe is not making contact with the DUT. The magnitude is high while the probe is being move towards the DUT. At time t1, a rapid rate of change of impedance magnitude and phase angle occurs as the probe contacts the surface. The magnitude and phase angle remain substantially constant for the contact period from t1 to t2.

When the probe is lifted at t2, there is another impedance magnitude and phase angle rate of change increase, where the magnitude and phase angle values return to the previous no-contact levels. At time t3, the probe is landed again, and there is another discontinuity in magnitude and phase angle.

FIG. 5A also shows a soft-contact situation, where there is a smaller discontinuity in impedance magnitude and phase angle at time t4. But the measured level of magnitude and phase angle are different for soft contact than for hard contact (e.g., magnitude and phase angle at time t4 are different than at time t1). As the probe is moved lower in z after contact (the initial smaller discontinuity), the magnitude and phase angle changes gradually over time between t4 and t5, as opposed to one sudden large discontinuity. The magnitude and phase angle reach a relatively constant level after time t5 matching the large discontinuity at t1. At time t6, the probe is lifted again.

Between time t3 and t4, the probe is landed and lifted in quick succession to show how impedance magnitude and phase angle can change with probe drift, thermal effects, or other conditions.

The above processes can be used to land one probe or multiple probes. Landing multiple probes can, for example, allow for different DUT testing scenarios.

FIG. 5B is a graphical representation 500 illustrating how rates of change of calculated impedance magnitude indicates probe tip location relative to a surface of a device under test in accordance with embodiments of the present disclosure. Similar to FIG. 5A, FIG. 5B is organized by time periods. During period t1-t2, the probe tip might be stationary or moving towards the DUT. Starting at time t2, there is observed a small rate of change of impedance magnitude, indicating that the probe tip is approaching the surface of the DUT. The rate of change of impedance magnitude during t2-t3 can trigger the control system to slow the rate of probe tip speed as it approaches the surface. Starting at time t3, the rate of change of impedance magnitude increases as compared to the values calculated during period t2-t3. The rate of change of impedance magnitude increasing during t3-t4 can indicate that the probe tip is moving slower than during the period t2-t3. The probe tip makes contact with the surface at time t4, which is shown a as a very high rate of change of impedance magnitude. At t5 and through t6, the probe tip is landed on the surface of the DUT.

In some embodiments, a bias can be applied to the probe tip during landing to address noise in signal measurements.

As mentioned briefly before, the impedance magnitude values and/or phase angle values measurements can be used to determine the surface and material of whatever the probe has landed on. Differentiating between a dielectric vs a metal or semiconducting structure can be used to verify that the probe has landed in the correct place. NMOS and PMOS structures can also be differentiated, as shown in FIGS. 6 and 7.

Figure 6A:
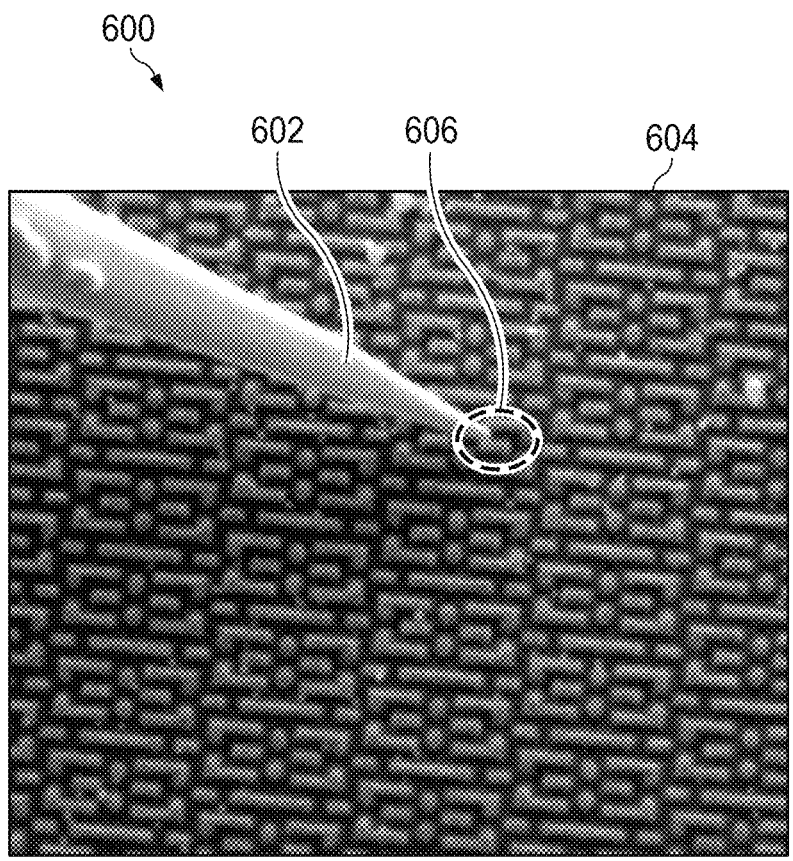
Figure 6C:
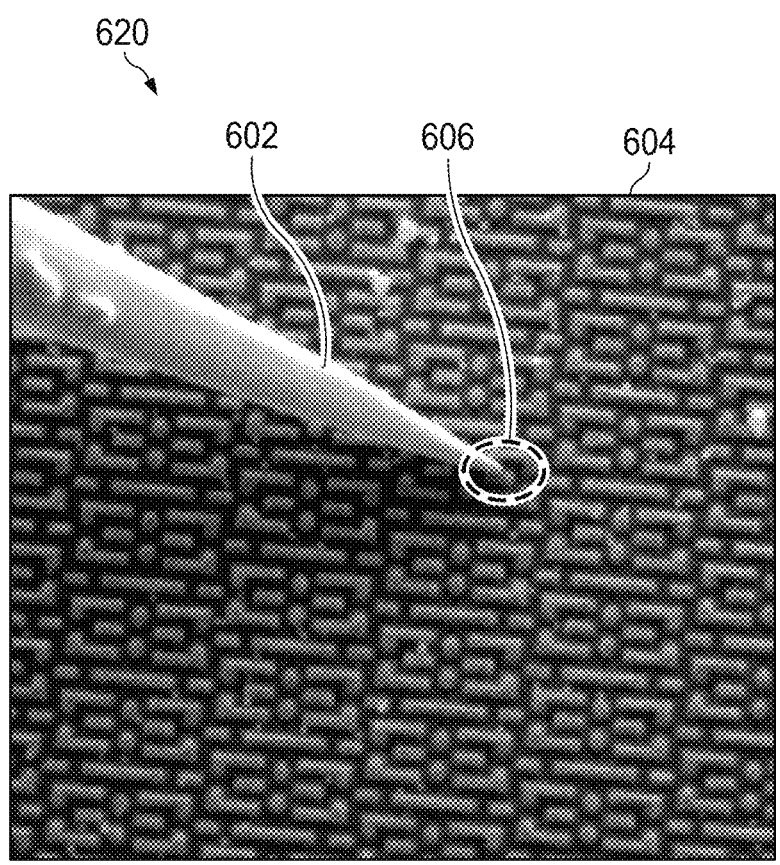
Figure 6D:
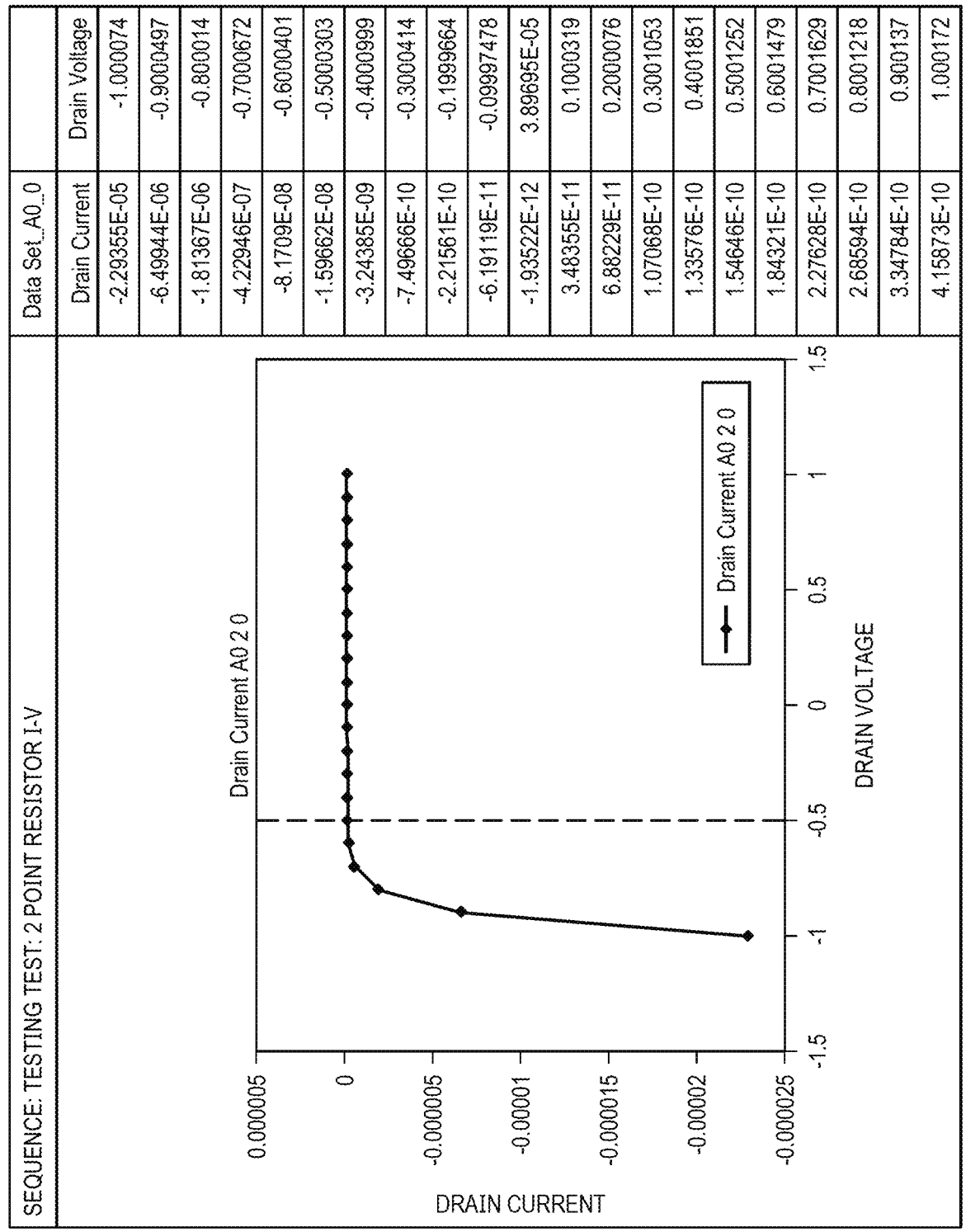

FIGS. 6A-D are images and graphs depicting n-type metal oxide semiconductor (NMOS) device source probe landing and testing in accordance with embodiments of the present disclosure. Dots on the graph represent values of Z and θ. FIG. 6A is a diagram 600 showing a probe 602 hovering over a chip 604 that includes a plurality of devices. The landing target 606 is a source contact of an NMOS device. (The DUT in this example is the NMOS device generally, and the source contact of the NMOS device, specifically). FIG. 6B is a diagram 610 showing the impedance magnitude and phase angle calculations for the NMOS source before and after landing the probe 602 on the source contact 606. As can be seen, data points are collected prior to moving the probe in the z-direction towards the source contact 606. At a time t1, the probe 602 is lowered towards the DUT. Prior to and during the time that the probe 602 is moving towards the DUT, the magnitude and phase angle are outside of the respective trigger values. At time t2, the probe 602 makes contact with the source contact 606. FIG. 6C is a diagram 620 showing probe 602 landed on source contact 606. It can be seen at time t2 that the magnitude drops and crosses a trigger value quickly; and the phase angle increases and crosses a trigger value quickly, as well. The discontinuity of magnitude and phase angle advantageously provides a fast trigger for stopping the motion of the probe 602. As shown in FIG. 5A, the discontinuity in magnitude and phase angle is repeatable. The probe 602 can then be used to test the NMOS device through the source contact. This is shown in FIG. 6D. FIG. 6D is a graph 630 showing drain current in response to applied voltage across the NMOS source.

Figure 7A:
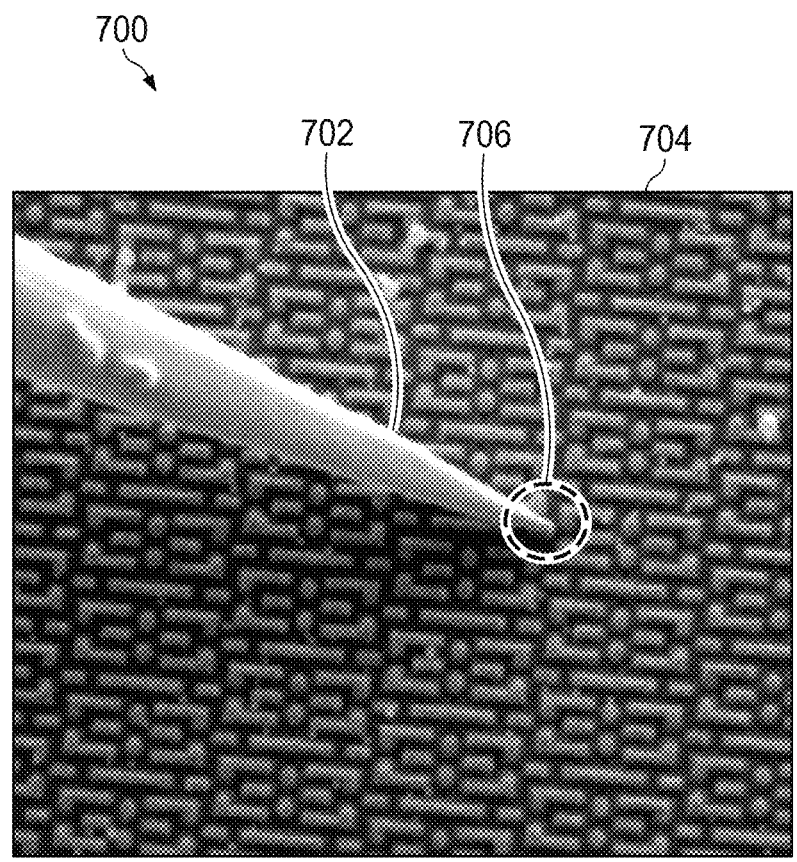
Figure 7C:
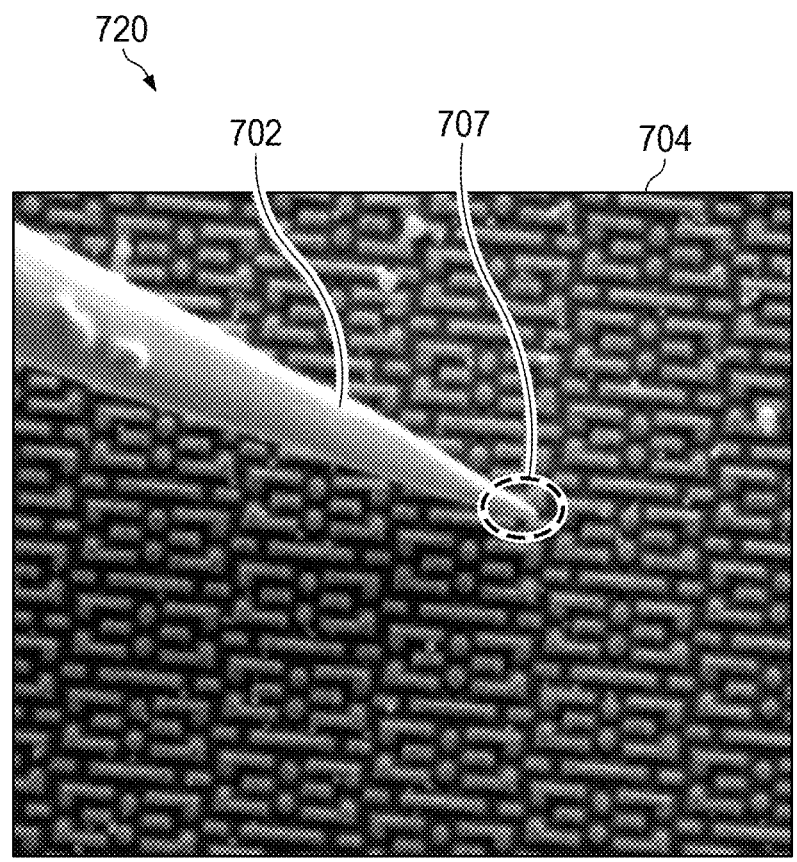
Figure 7D:
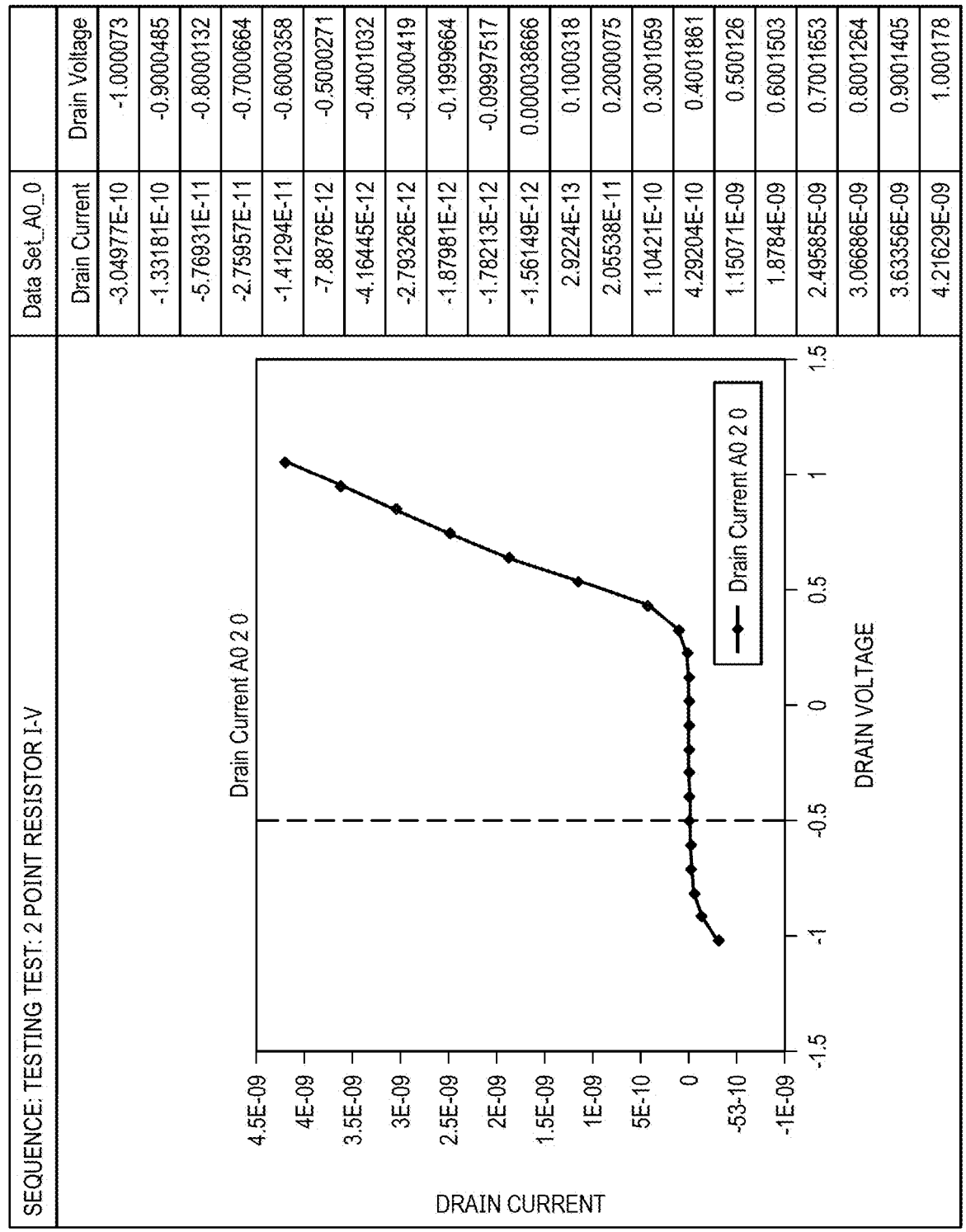

FIGS. 7A-D are images and graphs depicting p-type metal oxide semiconductor (PMOS) device source probe landing and testing in accordance with embodiments of the present disclosure. FIG. 7A is a diagram 700 showing a probe 702 hovering over a chip 704 that includes a plurality of devices. The landing target 706 is a source contact of a PMOS device. (The DUT in this example is the PMOS device generally, and the source contact of the PMOS device, specifically). FIG. 7B is a diagram 710 showing the impedance magnitude and phase angle calculations for the PMOS source before and after landing the probe 702 on the source contact 706. As can be seen, data points are collected prior to moving the probe in the z-direction towards the source contact 706. At a time t1, the probe 702 is lowered towards the DUT. Prior to and during the time that the probe 702 is moving towards the DUT, the magnitude and phase angle are outside of the respective trigger values. At time t2, the probe 702 makes contact with the source contact 706. FIG. 7C is a diagram 720 showing probe 702 landed on source contact 706. It can be seen at time t2 that the magnitude drops and crosses a trigger value quickly; and the phase angle increases and crosses a trigger value quickly, as well. The discontinuity of magnitude and phase angle advantageously provides a fast trigger for stopping the motion of the probe 702. As shown in FIG. 5A, the discontinuity in magnitude and phase angle is repeatable. The probe 702 can then be used to test the PMOS device through the source contact. This is shown in FIG. 7D. FIG. 7D is a graph 730 showing drain current in response to applied voltage across the PMOS source.

In some embodiments, detection of approach prior to discontinuity or landing detection can be accomplished using signal noise, impedance magnitude, and impedance phase angle. This approach detection can be used to slow the probe movement to have a soft landing.

Figure 8:
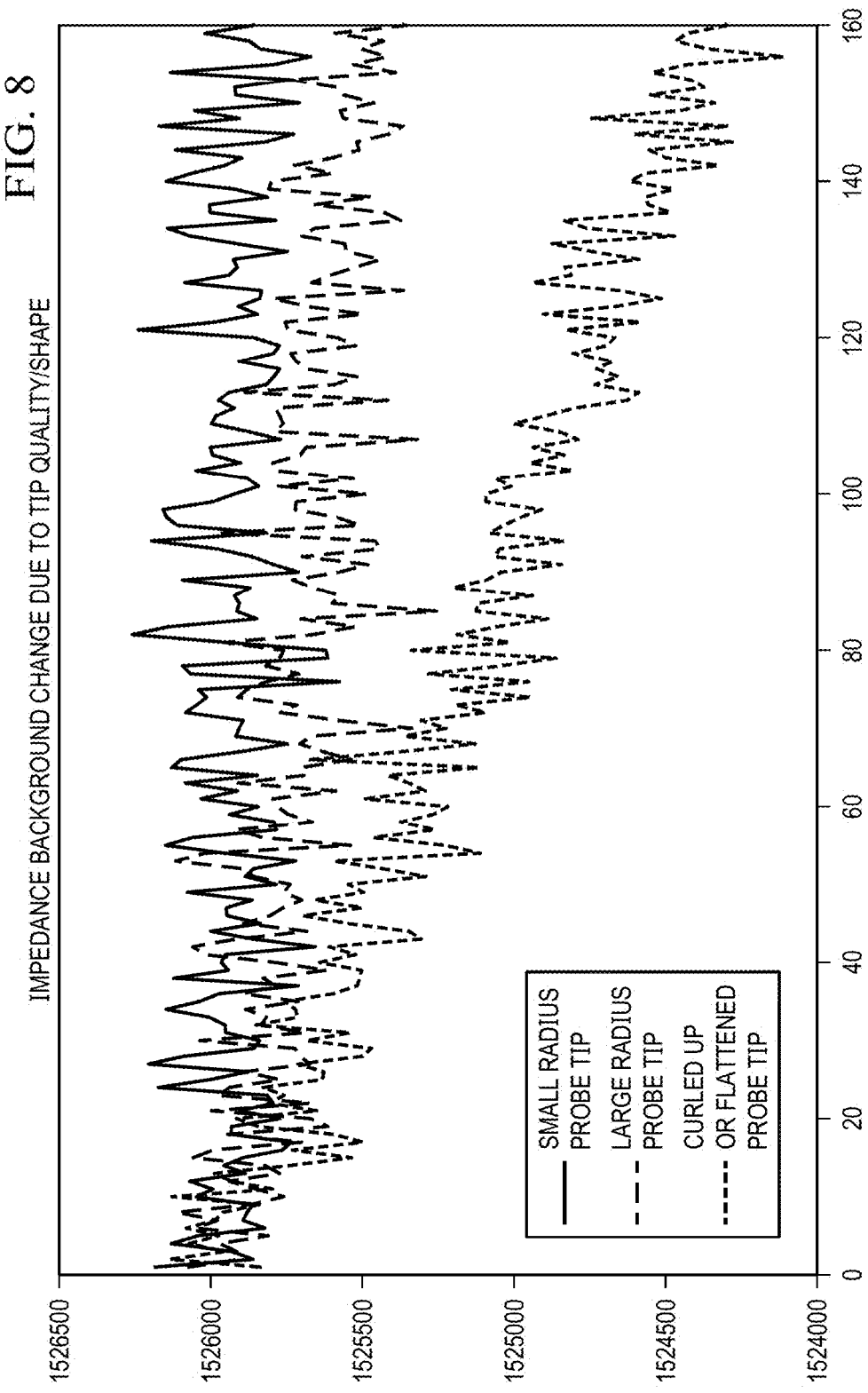
FIG. 8 is a graphical representation of impedance background signal changes due to changes in probe tip profile in accordance with embodiments of the present disclosure.

FIG. 8 is a graphical representation of impedance background signal changes due to changes in probe tip profile in accordance with embodiments of the present disclosure. The background signal from impedance magnitude calculations (and phase angle, though not shown) can indicate the geometric state of the probe tip itself. A probe tip with a small radius of curvature, such as new, sharp probe tip can be indicated by an impedance background signal that does not change or does not change quickly over time. A probe tip that has a larger radius of curvature can result in a small rate of change of impedance background signal. And damaged probe tip, such as one with a curled tip or a flattened tip, can result in a rate of change of impedance background signal that is high, relative to a large radius of curvature or small radius of curvature tip.

The word "exemplary" is used herein to mean "serving as an example, instance, or illustration." Any embodiment described herein as "exemplary" is not necessarily to be construed as preferred or advantageous over other embodiments.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

Some embodiments may be used in conjunction with one way and/or two-way radio communication systems, cellular radio-telephone communication systems, a mobile phone, a cellular telephone, a wireless telephone, a personal communication system (PCS) device, a PDA device which incorporates a wireless communication device, a mobile or portable global positioning system (GPS) device, a device which incorporates a GPS receiver or transceiver or chip, a device which incorporates an RFID element or chip, a multiple input multiple output (MIMO) transceiver or device, a single input multiple output (SIMO) transceiver or device, a single input single output (SISO) transceiver or device, a multiple input single output (MISO) transceiver or device, a device having one or more internal antennas and/or external antennas, digital video broadcast (DVB) devices or systems, multi-standard radio devices or systems, a wired or wireless handheld device, e.g., a smartphone, a wireless application protocol (WAP) device, or the like.

Certain aspects of the disclosure are described above with reference to block and flow diagrams of systems, methods, apparatuses, and/or computer program products according to various implementations. It will be understood that one or more blocks of the block diagrams and flow diagrams, and combinations of blocks in the block diagrams and the flow diagrams, respectively, may be implemented by computer-executable program instructions. Likewise, some blocks of the block diagrams and flow diagrams may not necessarily need to be performed in the order presented, or may not necessarily need to be performed at all, according to some implementations. Certain aspects of the disclosure may take the form of an entirely hardware embodiment, an entirely software embodiment (including firmware, resident software, micro-code, etc.), or an embodiment combining software and hardware aspects that may all generally be referred to herein as a "service," "circuit," "circuitry," "module," and/or "system."

The computer-executable program instructions may be loaded onto a special-purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable storage media or memory that may direct a computer or other programmable data processing apparatus to function in a particular manner, such that the instructions stored in the computer-readable storage media produce an article of manufacture including instruction means that implement one or more functions specified in the flow diagram block or blocks. As an example, certain implementations may provide for a computer program product, comprising a computer-readable storage medium having a computer-readable program code or program instructions implemented therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process, such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

The following examples pertain to embodiments in accordance with this Specification.

Example 1 is an automated method for landing a probe onto a device under test (DUT), the method including positioning, by an automated motion control system, a conductive probe above the DUT; applying, by signal measurement circuitry, electrical signals between the conductive probe and the DUT; measuring, by signal measurement circuitry, electrical responses from the applied electrical signal; calculating, by a processor, impedance magnitude values and/or phase angle values based on the measured electrical response values; causing, by the automated motion control system, the conductive probe to move towards the DUT while continuing to calculate impedance magnitude values and/or phase angle values from measured electrical response; determining, by the processor, that the conductive probe has contacted the DUT based on a change in the calculated impedance magnitude values and/or phase angle values; and signaling, by the processor, to the automated motion control system to stop moving the probe towards the DUT based on the change in the calculated impedance magnitude values and/or phase angle values. The motion control device can automatically stop the probe based on receiving the signal from the processor, which indicates that the probe has contacted the surface, such indication based on impedance and/or phase determinations.

Example 2 may include the subject matter of example 1, wherein determining that the conductive probe has contacted the DUT based on a change in calculated impedance magnitude values and/or phase angle values comprises determining, by the processor, a change in a rate of change of the calculated impedance magnitude value and/or phase angle value.

Example 3 may include the subject matter of any of examples 1-2, wherein the change in the calculated impedance magnitude values and/or phase angle values comprises a value, or average of values, changing a predetermined amount from a baseline or meeting/crossing an absolute value.

Example 4 may include the subject matter of any of examples 1-3, wherein the change in the calculated impedance magnitude values and/or phase angle values comprises a noise measurement, frequency or profile changing from a baseline or meeting/crossing an absolute measurement, frequency or profile.

Example 5 may include the subject matter of any of examples 1-4, wherein the change in the calculated impedance magnitude values and/or phase angle values comprises a rate of change changing a predetermined amount from a baseline or meeting/crossing an absolute rate of change.

Example 6 may include the subject matter of any of examples 1-5, further comprising performing an electrical test on the DUT.

Example 7 may include the subject matter of example 6, and can also include determining that the electrical test of the DUT is completed; signaling to the motion control device to separate the conductive probe from the DUT; and determining, by a processor, that the conductive probe has separated from the DUT based on the aforementioned change in the calculated impedance magnitude values and/or phase angle values.

Example 8 may include the subject matter of example 7, and can also include determining, based on a test plan, a second DUT to be tested; and signaling to the motion control device to position the conductive probe over the second DUT.

Example 9 may include the subject matter of example 8, wherein causing the conductive probe to be positioned over the second DUT includes identifying coordinates of the second DUT; and causing the conductive probe to position over the second DUT based on the coordinates of the second DUT.

Example 10 may include the subject matter of example 8, wherein causing the conductive probe to be positioned over the second DUT includes identifying coordinates of the second DUT; and causing the second DUT to be positioned under the conductive probe based on a translation of the coordinates of the second DUT.

Example 11 may include the subject matter of any of examples 1-10, and can also include determining, from a received impedance magnitude values and/or phase angle values, a type of the DUT based, at least in part, on a comparison of calculated impedance magnitude and phase angle against historic values.

Example 12 may include the subject matter of any of examples 1-11, and can also include prior to completion of the test of the DUT: stopping the test of the DUT; measuring impedance magnitude values and/or phase angle values; determining that the conductive probe has drifted or moved off of the DUT; repositioning the conductive probe onto the DUT; and completing the test of the DUT.

Example 13 may include the subject matter of any of examples 1-12, and can also include determining, by a processor, that the impedance magnitude values and/or phase angle values indicate a proximity between the conductive probe and the DUT; and signaling to the motion control device to increase or decrease the rate of motion of the conductive probe towards the DUT based on the proximity between the conductive probe and the DUT determined from the impedance magnitude values and/or the phase angle values.

Example 14 may include the subject matter of any of examples 1-13, and can also include determining, by a processor, that the impedance magnitude values and/or phase angle values indicate a physical geometry of the conductive probe; determining whether the physical geometry of the conductive probe is suitable to make contact with the DUT based on the impedance magnitude values and/or phase angle values; and signaling to the motion control device to stop and abort the process if the conductive probe does not have a physical geometry to make contact with the DUT, or signaling to the motion control device to continue moving the probe towards the DUT if the conductive probe does have a physical geometry to make contact with the DUT.

Example 15 is a system that includes a nanoprober that includes an actuator and to secure a conductive probe; a signal measurement circuit electrically coupled to the conductive probe, the signal measurement circuit to apply a signal to the conductive probe and receive a signal from the sample or apply signal to the sample and receive signal from probe, a motion control system to move the nanoprober actuator based on information received from the signal measurement circuitry; and a hardware processor to determine that information from the signal measurement circuitry indicates proximity of the conductive probe to a desired surface, and determine that information from the signal measurement circuitry indicates fitness or quality of the conductive probe, and determine that information from the signal measurement circuitry indicates that the conductive probe has landed on a desired surface, and signal to the motion control system to stop moving the nanoprober positioner based on the indication that the conductive probe has landed on the desired surface.

Example 16 may include the subject matter of example 15, wherein the motion control system is to lower the conductive probe towards the DUT while the signal measurement circuitry receives electrical information and the processor calculates impedance magnitude and phase angle between voltage and current based on the received electrical information.

Example 17 may include the subject matter of example 16, wherein the processor is to determine that the impedance magnitude or phase angle between voltage and current value received represents the conductive probe tip proximity to the DUT; and signal to the motion control system to change the probes rate of movement, based on proximity, towards the DUT.

Example 18 may include the subject matter of example 16, wherein the processor is to determine that the impedance magnitude or phase angle between voltage and current value received indicates an unusable probe tip to land on the DUT; and signal to the motion control system to stop moving the probe towards the DUT and abort the landing.

Example 19 may include the subject matter of example 16, wherein the processor is to determine that the impedance magnitude or phase angle between voltage and current value received meets or crosses a threshold value or any other change in behavior from calculated baselines; determine that the conductive probe has contacted the DUT based on the impedance magnitude or phase angle between voltage and current value meeting or crossing the threshold value or any other change in behavior from calculated baselines; and signal to the motion control system to stop moving the probe towards the DUT.

Example 20 may include the subject matter of any of examples 15-19, wherein the processor is to determine what the DUT is based on stored information; and perform an electrical test on the DUT through the signal measurement circuitry based on what the DUT is.

Example 21 may include the subject matter of example 20, the processor to determine that the electrical test of the DUT is completed; and signal to the motion control device to lift the conductive probe off of the DUT or to move the DUT away from the conductive probe.

Example 22 may include the subject matter of example 21, the processor to determine, based on a test plan, a second DUT to be tested; identify a location of the second DUT; and moving one or both of a sample stage carrying the second DUT and the probe tip so that the probe tip is over the second DUT.

Example 23 may include the subject matter of example 22, the processor to identify coordinates of the second DUT; and signal the motion control system to position the conductive probe over the second DUT or signal the motion control system to position the DUT under an origin of a charged particle beam (CPB) device based on the coordinates of the second DUT.

Example 24 may include the system of claim 23, the processor to identify coordinates of the second DUT; and signal the motion control system to position the conductive probe over the second DUT based on a translation of the coordinates of the second DUT.

Example 25 may include the subject matter of any of examples 15-24, the processor to determine, from a received impedance magnitude values and/or phase angle between voltage and current value, a type of the DUT based on a comparison of the calculated electrical information against historic values.

Example 26 may include the subject matter of any of examples 15-25, the processor to prior to completion of the electrical test of the DUT: stop the electrical test of the DUT; determine, through current received through the signal measurement circuitry, impedance magnitude values and/or phase angle between voltage and current; determine that the conductive probe has drifted or moved off of the DUT; signal the motion control system to reposition the conductive probe onto the DUT; and complete the electrical test of the DUT.

Example 27 is a system that includes a nanoprober system securing a conductive probe, a motion control system, a signal measurement circuit to apply a signal to the conductive probe and receive a signal from the sample or apply signal to the sample and receive signal from probe, a motion control system to move the nanoprober positioner based on information received from the signal measurement circuitry; and a hardware processor to positioning a conductive probe above the DUT by a motion control system; applying electrical signals between the conductive probe and the DUT; measuring electrical responses from the applied electrical signal;

calculating, by a processor, impedance magnitude values and/or phase angle values based on the measured electrical response values; causing, by the motion control device, the conductive probe to move towards the DUT while continuing to calculate impedance magnitude values and/or phase angle values from measured electrical response; determining, by the processor, that the conductive probe has contacted the DUT based on a change in the calculated impedance magnitude values and/or phase angle values; and signaling, by the processor, to the motion control device to stop moving the probe towards the DUT based on the change in the calculated impedance magnitude values and/or phase angle values.

Example 28 may include the subject matter of example 27, wherein determining that the conductive probe has contacted the DUT based on a change in calculated impedance magnitude values and/or phase angle values comprises determining, by the processor, a change in a rate of change of the calculated impedance magnitude value and/or phase angle value.

Example 29 may include the subject matter of any of examples 27-28, wherein the change in the calculated impedance magnitude values and/or phase angle values comprises a value, or average of values, changing a predetermined amount from a baseline or meeting/crossing an absolute value.

Example 30 may include the subject matter of any of examples 27-29, wherein the change in the calculated impedance magnitude values and/or phase angle values comprises a noise measurement, frequency or profile changing from a baseline or meeting/crossing an absolute measurement, frequency or profile.

Example 31 may include the subject matter of any of examples 27-30, wherein the change in the calculated impedance magnitude values and/or phase angle values comprises a rate of change changing a predetermined amount from a baseline or meeting/crossing an absolute rate of change.

Example 32 may include the subject matter of any of examples 27-31, and can also include performing an electrical test on the DUT.

Example 33 may include the subject matter of example 32, and can also include determining that the electrical test of the DUT is completed; signaling to the motion control device to separate the conductive probe from the DUT; and determining, by a processor, that the conductive probe has separated from the DUT based on the aforementioned change in the calculated impedance magnitude values and/or phase angle values.

Example 34 may include the subject matter of example 33, and can also include determining, based on a test plan, a second DUT to be tested; and signaling to the motion control device to position the conductive probe over the second DUT.

Example 35 may include the subject matter of example 34, wherein causing the conductive probe to be positioned over the second DUT includes identifying coordinates of the second DUT; and causing the conductive probe to position over the second DUT based on the coordinates of the second DUT.

Example 36 may include the subject matter of example 34, wherein causing the conductive probe to be positioned over the second DUT includes identifying coordinates of the second DUT; and causing the second DUT to be positioned under the conductive probe based on a translation of the coordinates of the second DUT.

Example 37 may include the subject matter of any of examples 27-36, and can also include determining, from a received impedance magnitude values and/or phase angle values, a type of the DUT based, at least in part, on a comparison of calculated impedance magnitude and phase angle against historic values.

Example 38 may include the subject matter of any of examples 27-37, and can also include prior to completion of the test of the DUT: stopping the test of the DUT; measuring impedance magnitude values and/or phase angle values; determining that the conductive probe has drifted or moved off of the DUT; repositioning the conductive probe onto the DUT; and completing the test of the DUT.

Example 39 may include the subject matter of any of examples 27-38, and can also include determining, by a processor, that the impedance magnitude values and/or phase angle values indicate a proximity between the conductive probe and the DUT; and signaling to the motion control device to increase or decrease the rate of motion of the conductive probe towards the DUT based on the proximity between the conductive probe and the DUT determined from the impedance magnitude values and/or the phase angle values.

Example 40 may include the subject matter of any of examples 27-39, and can also include determining, by a processor, that the impedance magnitude values and/or phase angle values indicate a physical geometry of the conductive probe; determining whether the physical geometry of the conductive probe is suitable to make contact with the DUT based on the impedance magnitude values and/or phase angle values; and signaling to the motion control device to stop and abort the process if the conductive probe does not have a physical geometry to make contact with the DUT, or signaling to the motion control device to continue moving the probe towards the DUT if the conductive probe does have a physical geometry to make contact with the DUT.

What is claimed is:

1. A method for landing a probe onto a device under test (DUT), the method comprising:
    positioning, using a motion control device, a conductive probe above the DUT by a motion control device;
    applying electrical signals between the conductive probe and the DUT;
    measuring electrical responses from the applied electrical signal;
    calculating, by a processor, impedance magnitude values and/or phase angle values based on the measured electrical response values;
    causing, by the motion control device, the conductive probe to move towards the DUT while continuing to calculate impedance magnitude values and/or phase angle values from measured electrical response;
    determining, by the processor, that the conductive probe has contacted the DUT based on a change in the calculated impedance magnitude values and/or phase angle values meeting or exceeding a threshold impedance magnitude value or threshold phase angle value;
    signaling, by the processor, to the motion control device to stop moving the probe towards the DUT based on the change in the calculated impedance magnitude values and/or phase angle values; and
    stopping, by the motion control device, the probe based on receiving a signal from the processor.

2. The method of claim 1, wherein determining that the conductive probe has contacted the DUT based on a change in calculated impedance magnitude values and/or phase angle values comprises determining, by the processor, a change in a rate of change of the calculated impedance magnitude value and/or phase angle value.

3. The method of claim 1, wherein the change in the calculated impedance magnitude values and/or phase angle values comprises a value, or average of values, changing a predetermined amount from a baseline or meeting/crossing an absolute value.

4. The method of claim 1, wherein the change in the calculated impedance magnitude values and/or phase angle values comprises a rate of change changing a predetermined amount from a baseline or meeting/crossing an absolute rate of change.

5. The method of claim 1, further comprising performing an electrical test on the DUT.

6. The method of claim 5, further comprising:
    determining that the electrical test of the DUT is completed;
    signaling to the motion control device to separate the conductive probe from the DUT; and determining, by a processor, that the conductive probe has separated from the DUT based on the aforementioned change in the calculated impedance magnitude values and/or phase angle values.

7. The method of claim 6, further comprising:
determining, based on a test plan, a second DUT to be tested; and
signaling to the motion control device to position the conductive probe over the second DUT.

8. The method of claim 7, wherein causing the conductive probe to be positioned over the second DUT comprises:
identifying coordinates of the second DUT; and
causing the conductive probe to position over the second DUT based on the coordinates of the second DUT.

9. The method of claim 7, wherein causing the conductive probe to be positioned over the second DUT comprises:
identifying coordinates of the second DUT; and
causing the second DUT to be positioned under the conductive probe based on a translation of the coordinates of the second DUT.

10. The method of claim 1, further comprising:
determining, from a received impedance magnitude values and/or phase angle values, a type of the DUT based, at least in part, on a comparison of calculated impedance magnitude and phase angle against historic values.

11. The method of claim 1, further comprising:
prior to completion of the test of the DUT:
stopping the test of the DUT;
measuring impedance magnitude values and/or phase angle values;
determining that the conductive probe has drifted or moved off of the DUT;
repositioning the conductive probe onto the DUT; and
completing the test of the DUT.

12. The method of claim 1, further comprising:
determining, by a processor, that the impedance magnitude values and/or phase angle values indicate a proximity between the conductive probe and the DUT; and
signaling to the motion control device to increase or decrease the rate of motion of the conductive probe towards the DUT based on the proximity between the conductive probe and the DUT determined from the impedance magnitude values and/or the phase angle values.

13. The method of claim 1, further comprising:
determining, by a processor, that the impedance magnitude values and/or phase angle values indicate a physical geometry of the conductive probe;
determining whether the physical geometry of the conductive probe is suitable to make contact with the DUT based on the impedance magnitude values and/or phase angle values; and
signaling to the motion control device to stop and abort the process if the conductive probe does not have a physical geometry to make contact with the DUT, or signaling to the motion control device to continue moving the probe towards the DUT if the conductive probe does have a physical geometry to make contact with the DUT.

14. A system comprising:
a nanoprober comprising an actuator and to secure a conductive probe;
a signal measurement circuit electrically coupled to the conductive probe, the signal measurement circuit to apply a signal to the conductive probe and receive a signal from the sample or apply signal to the sample and receive signal from probe,
a motion control system to move the nanoprober actuator based on information received from the signal measurement circuitry; and
a hardware processor to:
determine that a rate of change of impedance magnitude values or measured impedance phase angle values determined by the signal measurement circuitry indicates proximity of the conductive probe to a surface based on,
determine that a background trend of impedance magnitude values or measured impedance phase angle values by the signal measurement circuitry indicates fitness or quality of the conductive probe, and
determine that impedance magnitude values and/or phase angle values meeting or exceeding a threshold impedance magnitude value or threshold phase angle value determined by the signal measurement circuitry indicate that the conductive probe has landed on a surface, and
signal to the motion control system to stop moving the nanoprober positioner based on the indication that the conductive probe has landed on the desired surface.

15. The system of claim 14, wherein the motion control system is to lower the conductive probe towards the DUT while the signal measurement circuitry receives electrical information and the processor calculates impedance magnitude and phase angle between voltage and current based on the received electrical information.

16. The system of claim 15, wherein the processor is to:
determine that the impedance magnitude or phase angle between voltage and current value received represents the conductive probe tip proximity to the DUT; and
signal to the motion control system to change the probes rate of movement, based on proximity, towards the DUT.

17. The system of claim 15, wherein the processor is to:
determine that the impedance magnitude or phase angle between voltage and current value received indicates an unusable probe tip to land on the DUT; and
signal to the motion control system to stop moving the probe towards the DUT and abort the landing.

18. The system of claim 15, wherein the processor is to:
determine that the impedance magnitude or phase angle between voltage and current value received meets or crosses a threshold value;
determine that the conductive probe has contacted the DUT based on the impedance magnitude or phase angle between voltage and current value meeting or crossing the threshold value or any other change in behavior from calculated baselines; and
signal to the motion control system to stop moving the probe towards the DUT.

19. The system of claim 14, wherein the processor is to:
determine what the DUT is based on stored information; and
perform an electrical test on the DUT through the signal measurement circuitry based on what the DUT is.

20. The system of claim 19, the processor to:
determine that the electrical test of the DUT is completed; and
signal to the motion control system to lift the conductive probe off of the DUT or to move the DUT away from the conductive probe.

21. The system of claim 20, the processor to:
determine, based on a test plan, a second DUT to be tested;

identify a location of the second DUT; and moving one or both of a sample stage carrying the second DUT and the probe tip so that the probe tip is over the second DUT.

22. The system of claim 21, the processor to:

identify coordinates of the second DUT; and signal the motion control system to position the conductive probe over the second DUT or signal the motion control system to position the DUT under an origin of the CPB device based on the coordinates of the second DUT.

23. The system of claim 22, the processor to:

identify coordinates of the second DUT; and signal the motion control system to position the conductive probe over the second DUT based on a translation of the coordinates of the second DUT.

24. The system of claim 19, the processor to:

determine, from a received impedance magnitude values and/or phase angle values, a type of the DUT based on a comparison of calculated electrical information from the electrical test against historic values.

25. The system of claim 19, the processor to:

prior to completion of the electrical test of the DUT:

stop the electrical test of the DUT;

determine, through current received through the signal measurement circuitry, impedance magnitude values and/or phase angle between voltage and current;

determine that the conductive probe has drifted or moved off of the DUT;

signal the motion control system to reposition the conductive probe onto the DUT; and complete the electrical test of the DUT.

\* \* \* \* \*